(12) United States Patent
Hirano et al.

(10) Patent No.: US 6,498,483 B1
(45) Date of Patent: Dec. 24, 2002

(54) DEVICE AND METHOD FOR EASILY ADJUSTING WORKING POINT OF SQUID

(75) Inventors: Tetsuya Hirano, Itami (JP); Tatsuoki Nagaishi, Itami (JP); Hideo Itozaki, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/544,987

(22) Filed: Apr. 7, 2000

(30) Foreign Application Priority Data

| Apr. 9, 1999 | (JP) | ............................................ | 11-102921 |
| Apr. 9, 1999 | (JP) | ............................................ | 11-102922 |
| Apr. 9, 1999 | (JP) | ............................................ | 11-102923 |
| Apr. 9, 1999 | (JP) | ............................................ | 11-102924 |

(51) Int. Cl.$^7$ .............................................. G01R 33/02
(52) U.S. Cl. ....................................... 324/248; 505/846
(58) Field of Search ............................... 324/248, 244; 505/845, 846–872; 327/527, 528

(56) References Cited

U.S. PATENT DOCUMENTS

| 4,689,559 | A |   | 8/1987  | Hastings et al. | ............. | 324/248 |
| 5,194,808 | A | * | 3/1993  | Shitaku et al.  | ............. | 324/248 |
| 5,291,135 | A |   | 3/1994  | Hotta et al.    | ............. | 324/248 |
| 5,453,690 | A |   | 9/1995  | Krueger et al.  | ............. | 324/248 |
| 5,469,057 | A | * | 11/1995 | Robinson        | ............. | 324/248 |
| 6,211,519 | B1 | * | 4/2001 | Nam et al.      | ............. | 250/336.2 |

FOREIGN PATENT DOCUMENTS

| DE | 41 39 212  | 6/1992  |
| EP | 0 479 206  | 4/1992  |
| EP | 0 499 968  | 8/1992  |
| EP | 0 584 867  | 3/1994  |
| EP | 0 837 337  | 4/1998  |
| JP | 3-131781   | 6/1991  |
| JP | 4-99980    | 3/1992  |
| JP | 4-340488   | 11/1992 |
| JP | 6-275872   | 9/1994  |
| JP | 7-280903   | 10/1995 |
| JP | 9-148637   | 6/1997  |
| JP | 11-148967  | 6/1999  |

OTHER PUBLICATIONS

Patent Abstracts of Japan, vol. 016, No. 333 (P–1389), Mitsubishi Electric Corporation, Jul. 20, 1992.

Patent Abstracts of Japan, vol. 017, No. 189 (P–1521), Seiko Instr. Inc., Apr. 13, 1993.

\* cited by examiner

*Primary Examiner*—Edward Lefkowitz
*Assistant Examiner*—Subhash Zaveri
(74) *Attorney, Agent, or Firm*—Foley & Lardner

(57) ABSTRACT

A SQUID bias current adjustment device supplies a sinusoidal current at 40 kHz, for example, to a coil to generate magnetic field at a SQUID. The amplitude of the field corresponds to a half period of a field-voltage characteristic. Voltage generated from the SQUID at this time is filtered by using a filter to pick out components of 40 kHz and 80 kHz. The picked out signal components are rectified and converted to direct current, and the bias current is adjusted such that the maximum value is obtained. In this way, a SQUID bias current adjustment device can be provided capable of automatically adjusting bias current properly in a short period of time.

13 Claims, 24 Drawing Sheets

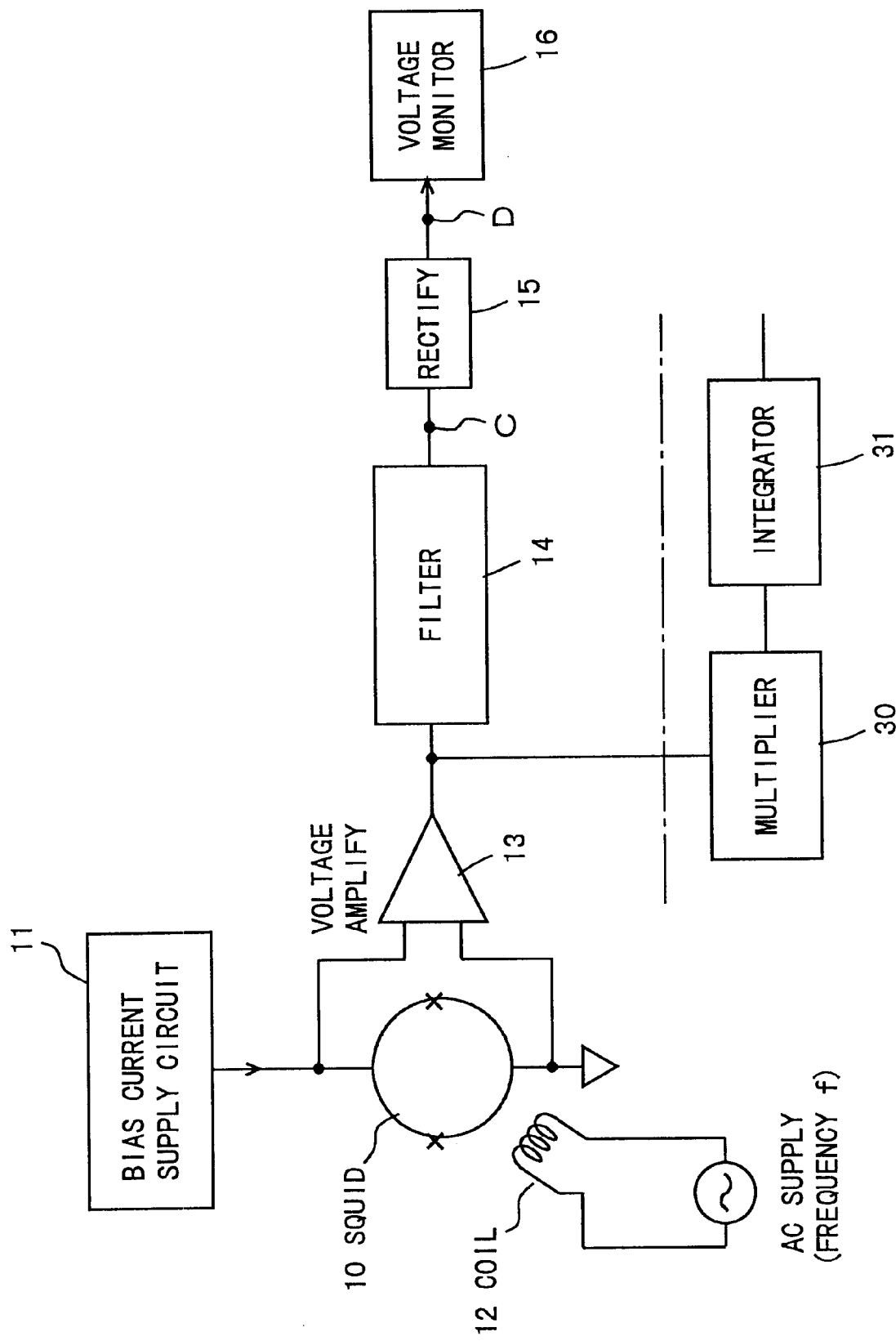

MENU SCREEN

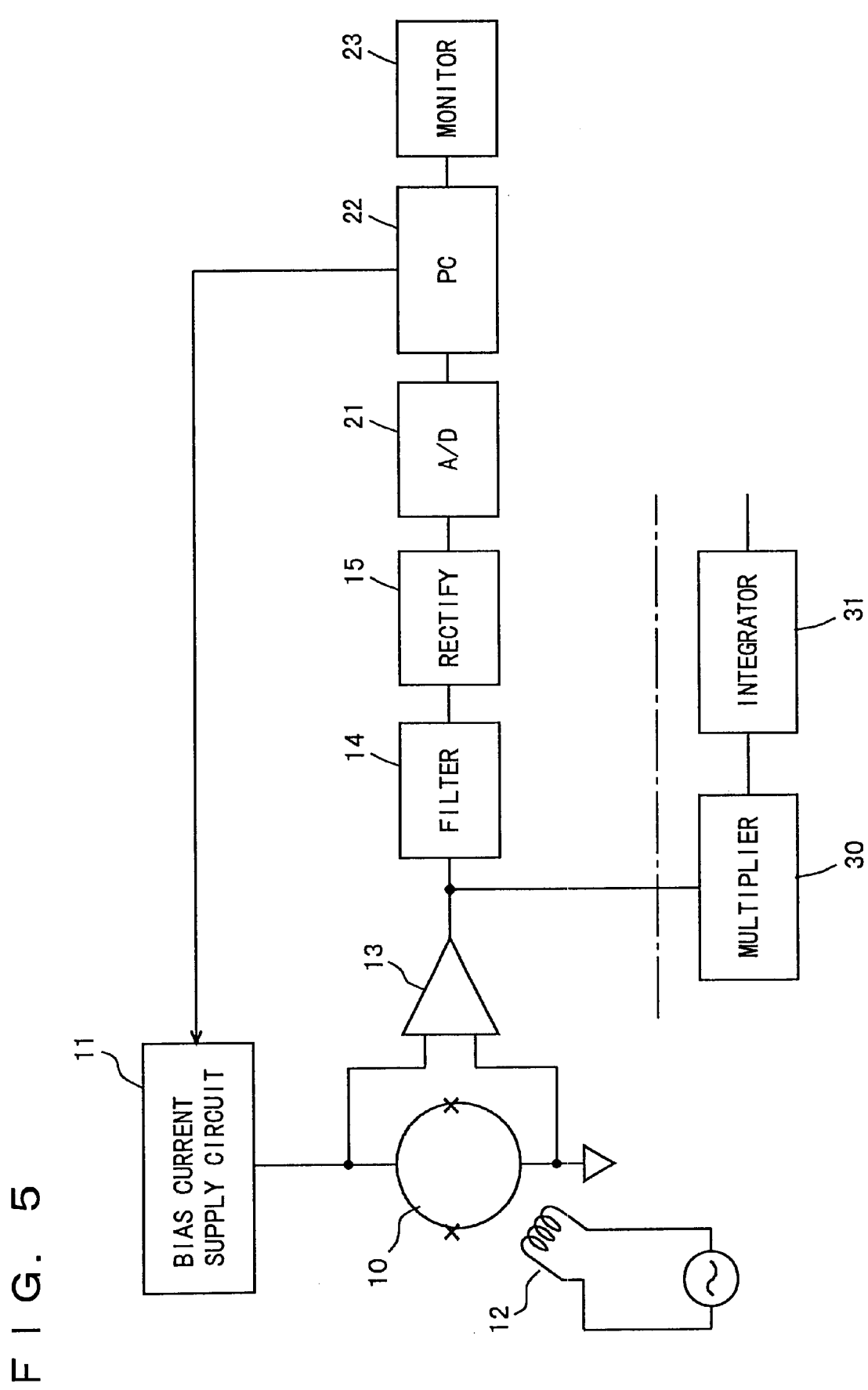

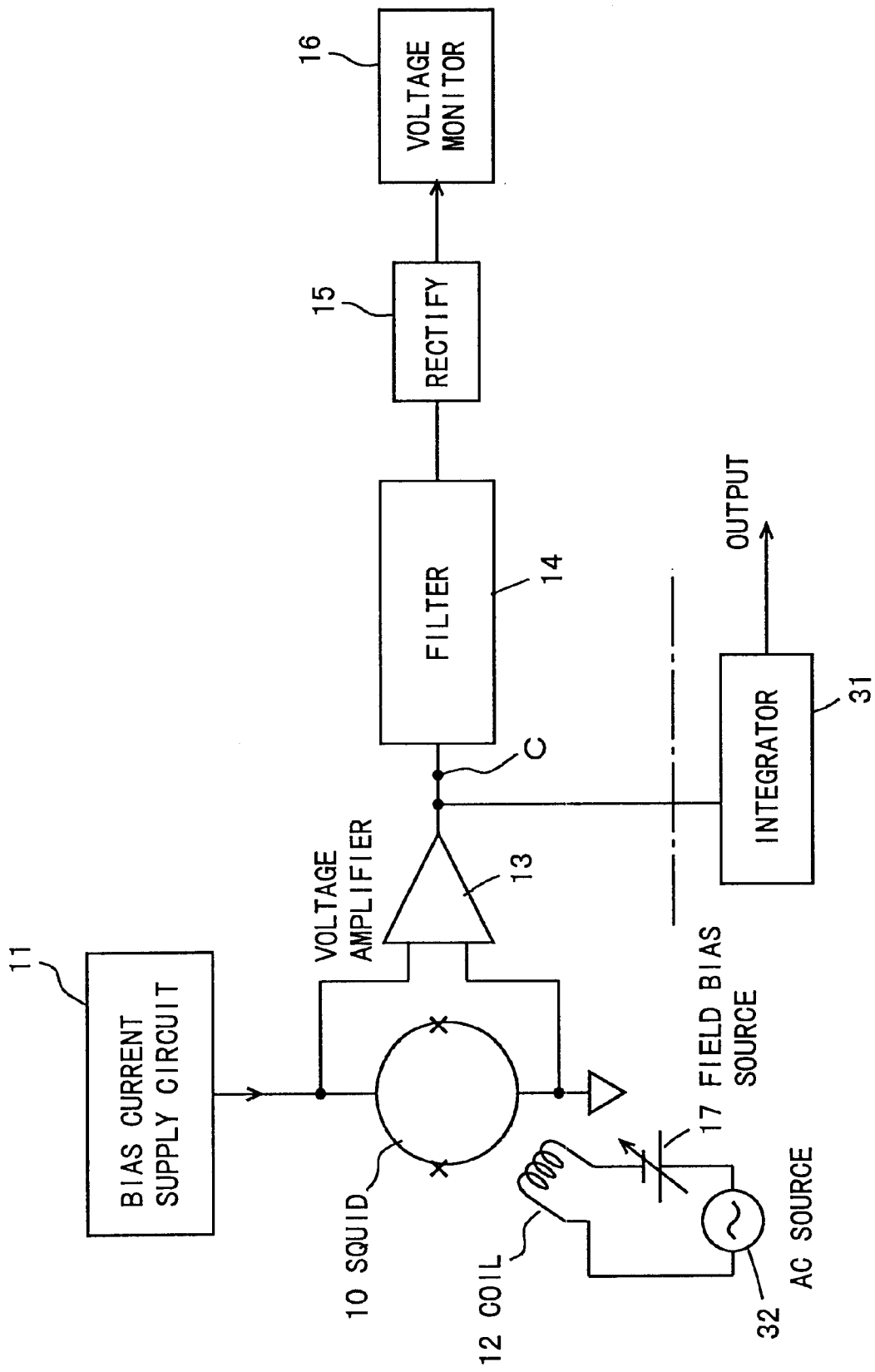
F I G. 7

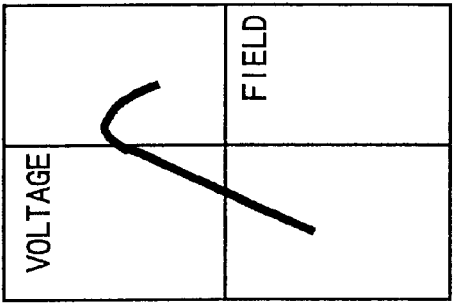
F I G. 8B
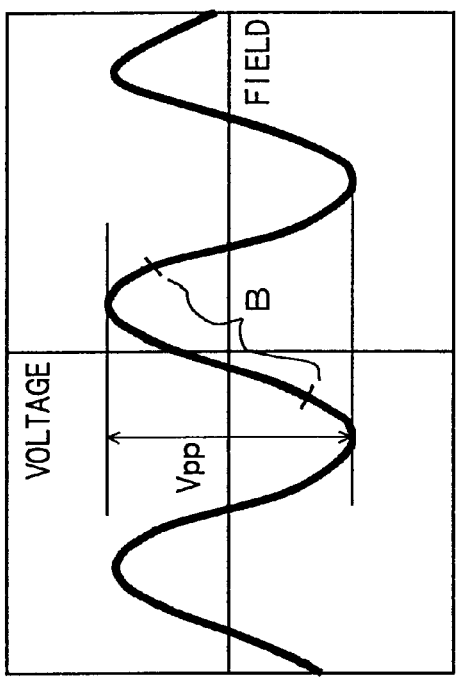
F I G. 8A
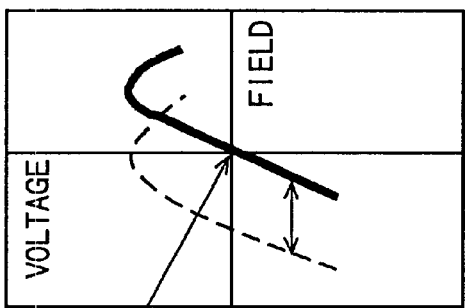
F I G. 8C

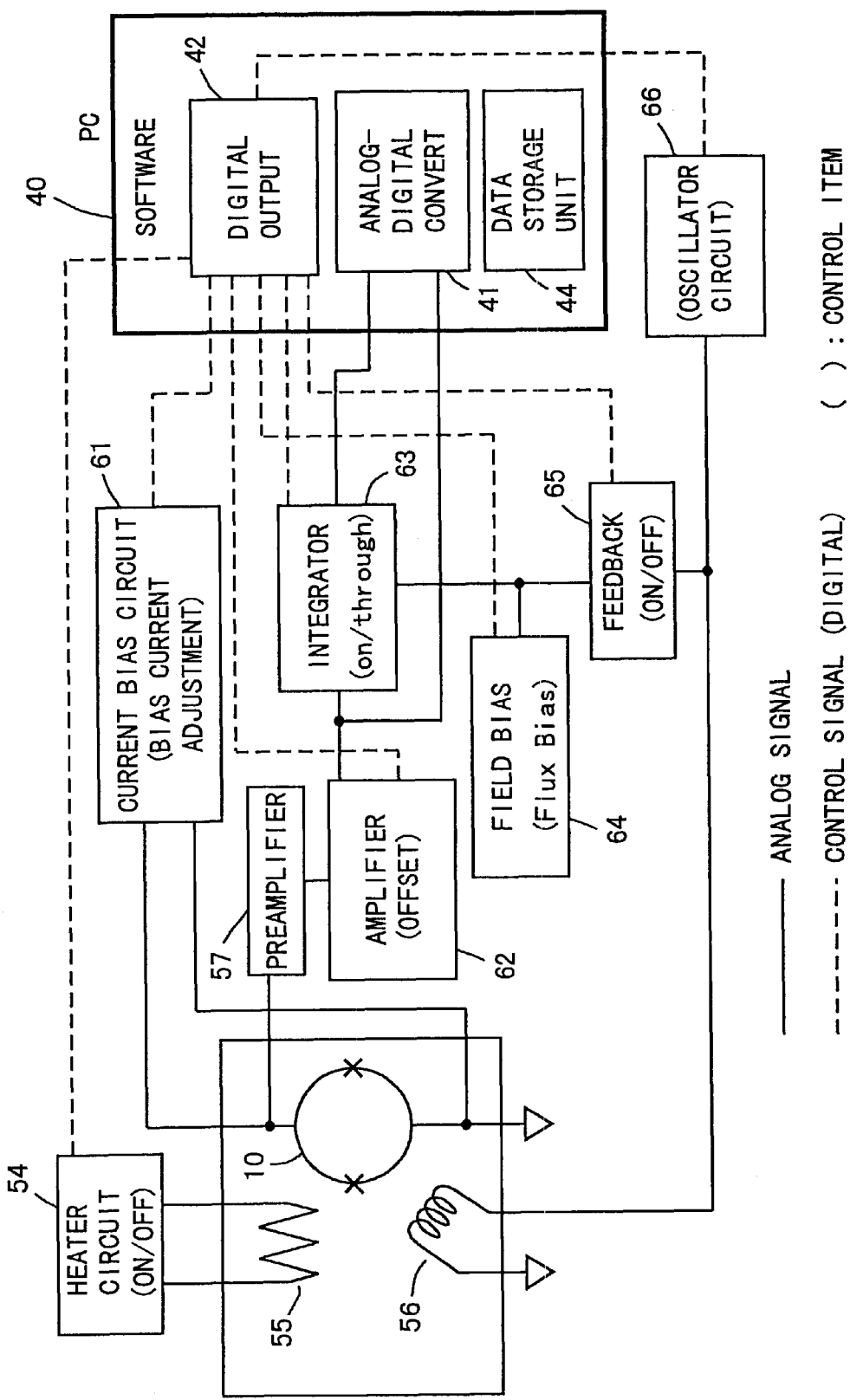
F I G. 1 3

F I G. 2 4  PRIOR ART

DEVICE AND METHOD FOR EASILY ADJUSTING WORKING POINT OF SQUID

BACKGROUND OF THE INVENTION

1. Field of the Invention

The present invention relates to a device and a method for adjusting a working point of a superconducting quantum interference device (hereinafter referred to as SQUID). In particular, the invention relates to a device and a method for achieving automatic adjustment of a working point of a SQUID.

2. Description of the Background Art

FIG. 23 is a circuit diagram showing a conventional control circuit for a SQUID with a flux locked loop (hereinafter referred to as FLL). Referring to FIG. 23, the conventional SQUID FLL circuit includes a SQUID 81 having two Josephson junctions formed at predetermined positions and a constant current source 88 supplying constant current to SQUID 81. Magnetic flux to be measured is input from a pickup coil (not shown) to SQUID 81. Voltage output through both ends of SQUID 81 is converted by a transformer 83a, amplified by a preamplifier 83b and then output from an output portion through a multiplier 84 and an integrator 85. A modulation signal at 40 kHz is added by a modulating unit 87 to the output from multiplier 84 for feedback to a field application coil 82 adjacent to SQUID 81. Accordingly, external magnetic flux detected at SQUID 81 is cancelled.

The output of SQUID 81 is input partially to the X axis of an oscilloscope 90 and the output of preamplifier 83b is input to the Y axis of oscilloscope 90.

According to the method above for adjusting the working point of the SQUID by the conventional SQUID control circuit, the amplitude should be adjusted to the maximum by using oscilloscope 90 with a predetermined bias current Ib being applied to the SQUID, and consequently a problem arises of time-consuming adjustment before use. Further, since the adjustment must be made manually, automatic adjustment of the SQUID is impossible.

FIG. 24 is a circuit diagram showing a conventional non-modulation type SQUID control circuit with a flux locked loop (FLL). Referring to FIG. 24, the non-modulation type SQUID control circuit is basically identical to the modulation type control circuit in FIG. 23 except that the former does not include modulating unit 87.

In the initial setting of the non-modulation type SQUID control circuit, a magnetic field bias current is adjusted at an optimum value by watching a waveform on an oscilloscope 90.

According to the method above for adjusting the working point of the SQUID by the conventional SQUID control circuit of non-modulation type, the field bias current applied to a field application coil 82 should be adjusted to allow the amplitude of the waveform of an output signal from the SQUID to attain the maximum by watching oscilloscope 90 with a predetermined bias current Ib applied to the SQUID, and consequently a problem arises of time-consuming adjustment before use. In addition, since the adjustment must be made manually, automatic adjustment of the SQUID is impossible.

Although the SQUID can detect an extremely weak magnetic flux when used for a magnetometer, for example, the SQUID cannot fully fulfill its function due to the influence of noise such as thermal noise caused by an amplifier employed and the like, due to stability concern of circuits such as amplifier, and the like. In order to solve this problem, a circuit according to the synchronous detection system as shown by the block diagram of FIG. 25 has been employed.

Referring to FIG. 25, an output of a SQUID element 91 detecting magnetic flux is input to a lock-in amplifier 93 via a step-up transformer 92. Lock-in amplifier 93 performs synchronized detection based on a synchronizing signal supplied from an oscillator 87 and supplies the result of detection to a DC amplifier 95. The synchronizing signal from oscillator 87 is also superimposed on an output current from DC amplifier 95 and applied to a feedback coil 96. Accordingly, coil 96 generates a magnetic field on which alternating field corresponding to the synchronizing signal is superimposed, this magnetic field is detected by SQUID element 91 and thus a flux locked loop is formed. DC amplifier 95 outputs a signal proportional to the flux density detected by SQUID 91.

A heater 97 is provided in the vicinity of SQUID element 91. Magnetic flux is trapped within a hole of SQUID element 91 when a magnetic field existing in cooling of SQUID element 91 attains a temperature equal to or less than the critical temperature of the superconductor. The trapped flux is released by increasing the temperature by heater 97 to a temperature of at least the critical current. Heater 97 is driven by a power supply circuit 98 and current is supplied to heater 97 as required.

As a conventional heater for releasing magnetic flux, wire dedicated to the heater is processed to form the heater or a resistor having a capacity corresponding to the power supplied to the heater has been employed. Therefore, a resistor having an allowable input greater than 1 W, if 1 W of input power is required for releasing the magnetic flux, or fabrication of a heater having such an allowable input is necessary.

FIG. 26 shows an outside view of a superconducting magnetic sensor using a resistor with an allowable input of 1 W. Referring to FIG. 26, superconducting magnetic sensor 74 includes a SQUID element 75 of about 5 mm×5 mm in size and a resistor 76 of 1 W having a length of about 10 mm that is placed adjacently to SQUID element 75, which are provided on a chip carrier 77 with a diameter of about 30 mm. Resistor 76 occupies a large area on chip carrier 77 as shown in FIG. 26.

The conventional heater employed must have a large allowable input, so that the SQUID cannot be made compact.

SUMMARY OF THE INVENTION

One object of the present invention is to provide a device and a method which are easy to use for adjusting a working point of a SQUID.

Another object of the present invention is to provide a device and a method for adjusting a working point of a SQUID which improve precision of SQUID adjustment and enable automatic adjustment.

A further object of the present invention is to provide a device and a method for adjusting a working point of a non-modulation type SQUID which improve precision of SQUID adjustment and enable automatic adjustment.

A further object of the present invention is to provide an easy-to-use SQUID magnetometer capable of easily performing the entire operation including working point adjustment in a short period of time.

A further object of the present invention is to provide a compact heater for a superconducting magnetic sensor.

The objects above are accomplished by a SQUID working point adjustment device including following elements. Specifically, a SQUID working point adjustment device according to one aspect of the invention includes a SQUID, a unit for supplying a bias current to the SQUID, a unit for applying an alternating source at a predetermined frequency to the SQUID to which the bias current is being supplied to generate magnetic field, a unit for picking out from the generated field a signal corresponding to a half period, and a unit for determining an optimum value of the bias current based on the signal corresponding to change of the field.

According to another aspect of the invention, a method of adjusting a working point of a SQUID includes the steps of supplying a bias current to the SQUID, applying an alternating source at a predetermined frequency to the SQUID to which the bias current is being supplied to generate magnetic field, picking out from the generated field magnetic field corresponding to a half period, and determining an optimum value of the bias current based on an output corresponding to change of the picked out field.

The magnetic field is generated at the SQUID to which the bias current is being applied, and the optimum value of the bias current is determined based on an output corresponding to change of the field. Accordingly, the optimum value of the bias current can automatically be determined. Further, precision of the adjustment of the bias current is improved.

According to a further aspect of the invention, a SQUID working point adjustment device includes a SQUID, a unit for supplying a predetermined bias current to the SQUID, and a coil for applying magnetic field to the SQUID. An alternating current at a first frequency and an adjustable direct current are applied to the coil. The SQUID working point adjustment device further includes a unit for picking out a field-voltage characteristic signal corresponding to a half period from the SQUID to which the bias current is being supplied, a filter for passing only a component of the first frequency in the picked out field-voltage characteristic signal, and a monitor for monitoring the signal component passed through the filter.

Preferably, the adjustment device further includes an adjusting unit for adjusting the direct current applied to the coil such that the signal component passed through the filter is at its maximum. At this time, the field sensitivity of the SQUID is maximized.

According to a further aspect of the invention, a method of adjusting a working point of a SQUID includes the steps of applying a predetermined bias current to the SQUID and applying magnetic field to SQUID using a coil. An alternating voltage at a first frequency and an adjustable direct voltage are applied to the coil. The adjusting method further includes the steps of picking out a field-voltage characteristic signal corresponding to a half period from the SQUID to which the bias current is being applied, picking out from the picked out field-voltage characteristic signal only a component of the first frequency, and monitoring the signal component.

The magnetic field is generated at the SQUID to which the bias current is being applied, and an optimum value of the field bias current is determined based on an output corresponding to change of the field, so that the optimum value of the field bias current is easily determined. The bias current is also adjusted more precisely. Further, as the optimum value of the field bias current can be determined, the working point of the SQUID can automatically be adjusted.

A SQUID magnetometer according to the present invention includes a SQUID, an application unit for applying a predetermined bias current to the SQUID, a detector for detecting an output of the SQUID to which the bias current is being applied, a feedback unit for feeding the output of the SQUID back to the SQUID, an application unit for applying a bias field to the feedback unit, and a controller for automatically adjusting the bias field in a state that the bias current is adjusted such that an output voltage of the SQUID is at its maximum.

The bias field is accordingly adjusted automatically in the state that the bias current is adjusted to allow the output voltage of the SQUID to be the maximum one. Manual manipulation of an oscilloscope as conventionally done is thus unnecessary. An easily operable SQUID magnetometer can be provided in this way.

Preferably, the controller includes a data storage unit for storing flux data measured by using the SQUID magnetometer.

Still preferably, the controller further includes an analyzer for analyzing flux data measured by using the SQUID magnetometer.

Still preferably, the SQUID magnetometer further includes a heater for releasing trapped flux, and the controller controls the heater for releasing the trapped flux.

According to a further aspect of the invention, a heater for a superconducting magnetic sensor employing a SQUID element for releasing flux of the superconducting magnetic sensor has a fixed allowable input power. A predetermined input power is applied to the heater for releasing the flux, the allowable input power of the heater being lower than the predetermined applied power.

At a low temperature (about −200° C.) which releases the flux of the superconducting magnetic sensor with the SQUID, a rated allowable power at a room temperature has no meaning, and accordingly a resistor having a lower allowable power can be employed. The heater with an allowable input power smaller than the actual input power is used so that the heater and thus the entire device can be made compact.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing a main portion of a SQUID working point adjustment device according to a first embodiment of the invention.

FIG. 5 is a block diagram showing a main portion of a SQUID working point adjustment device according to a modification of the first embodiment.

FIG. 7 is a block diagram showing a main portion of a SQUID working point adjustment device according to a second embodiment of the invention.

FIGS. 8A to 8C are graphs illustrating a voltage-field characteristic in the second embodiment.

FIG. 13 is a block diagram showing a main portion of the SQUID magnetometer according to the third embodiment.

DESCRIPTION OF THE PREFERRED EMBODIMENTS

Embodiments of the present invention are now described in conjunction with the drawings.

First Embodiment

Figure 23:
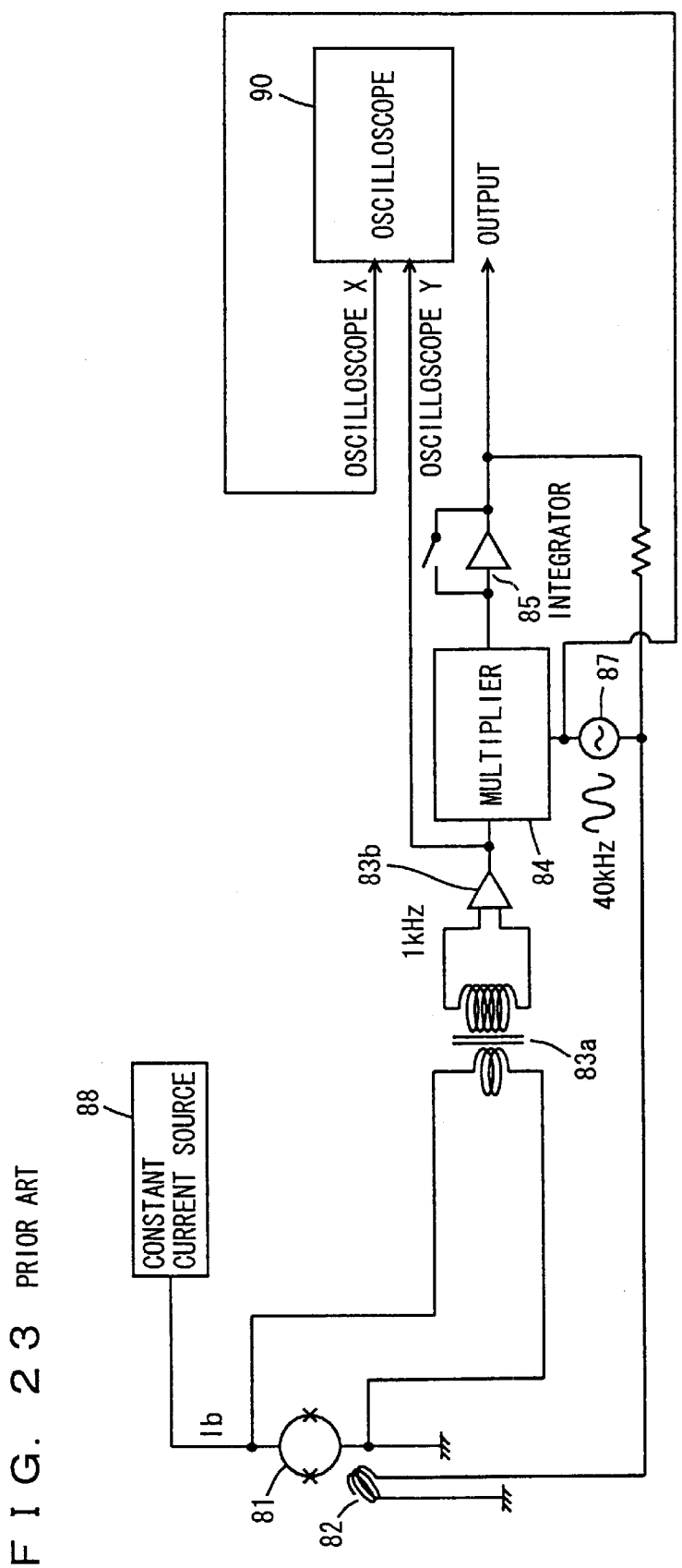
FIG. 23 illustrates a conventional method of adjusting a working point of a modulation type SQUID.
Figure 24:
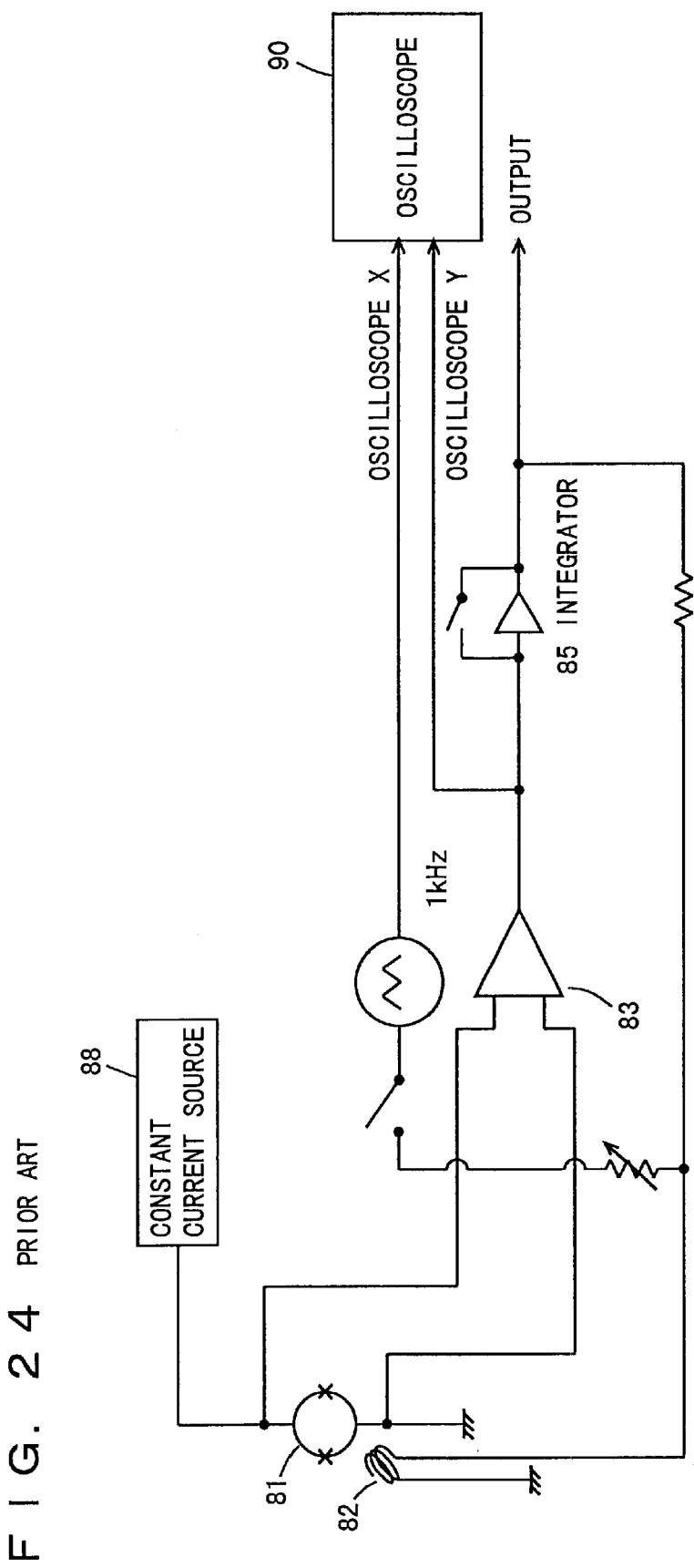
FIG. 24 illustrates a conventional method of adjusting a working point of a non-modulation type SQUID.
Figure 25:
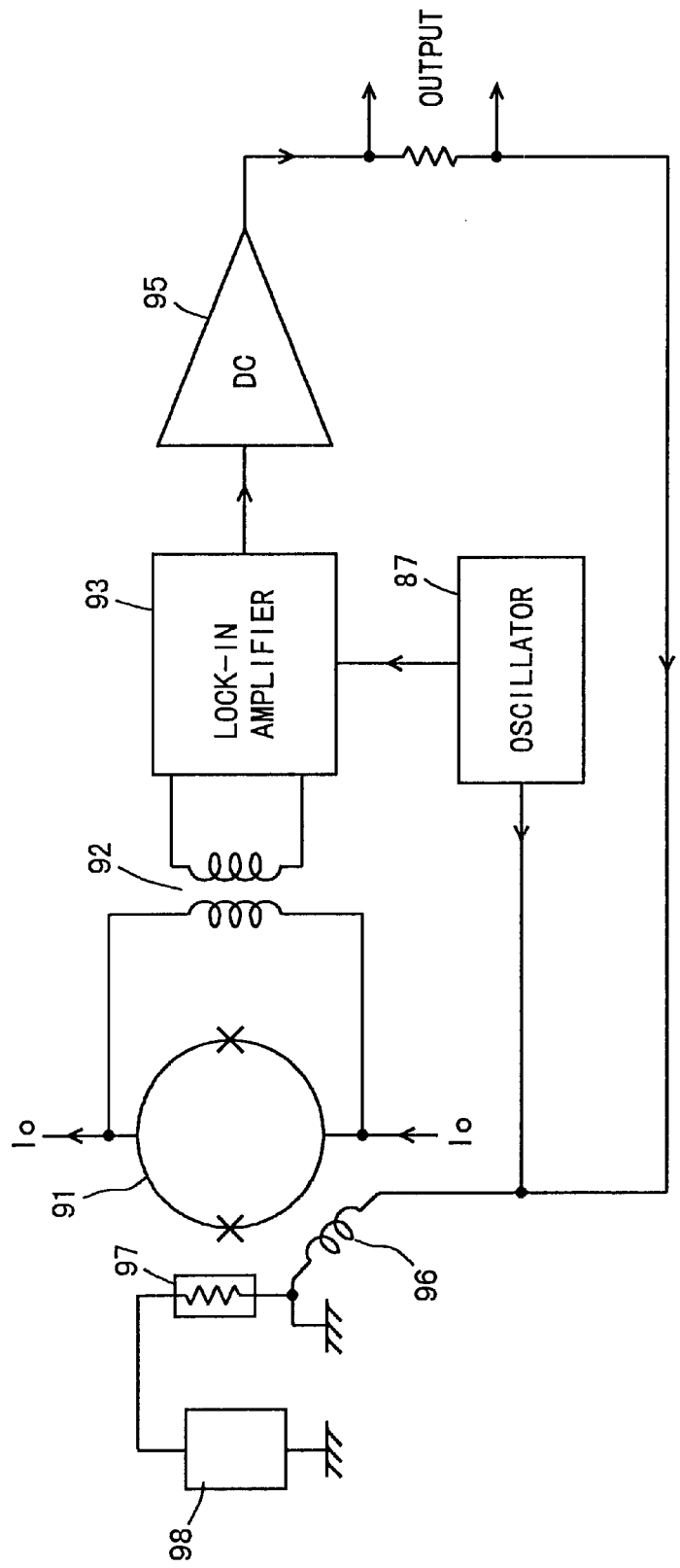
FIG. 25 is a block diagram showing a conventional SQUID.

The first embodiment relates to a modulation type SQUID working point adjustment device. Referring to FIG. 1, a bias current adjustment device according to the first embodiment includes a SQUID 10, a bias current supply circuit 11 applying a bias current to SQUID 10, a coil 12 applying an alternating field at a frequency f to SQUID 10, a voltage amplifier 13 amplifying voltage through both ends of SQUID 10, a filter 14 passing only a predetermined component in the amplified voltage, a rectifier 15 rectifying a signal of the predetermined frequency component, and a voltage monitor 16 for monitoring the rectified voltage. In a device employing an actual SQUID, an output of voltage amplifier 13 is coupled to a multiplier 30 and an integrator 31 corresponding respectively to multiplier 84 and integrator 85 shown in FIG. 23 and thus a flux locked loop is formed to measure a magnetic field. However, the actual measurement system is not described here and only the initial adjustment is discussed.

Figure 2:
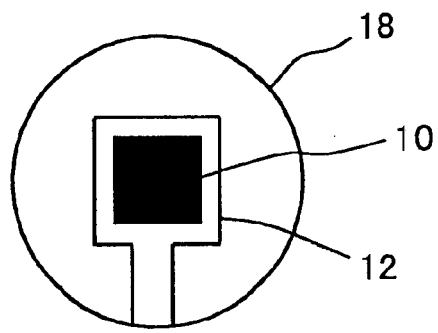
FIG. 2 shows an outside view of a SQUID to which the first embodiment is applied.

FIG. 2 shows an entire structure of SQUID 10 to which the invention is applied. Referring to FIG. 2, SQUID 10 is of a washer type which is 5 mm or less in size. A coil 12 with one turn and 7×7 mm in size is patterned around it. These are formed on a chip carrier 18. A sinusoidal current at 40 kHz is applied through coil 12 to generate magnetic field. The amplitude of the field corresponds to a half period of a field-voltage characteristic. At this time, voltage generated from SQUID 10 is filtered by the structure as described above, the filtered voltage is converted to a direct voltage, and the bias current is adjusted such that a maximum value of the voltage is obtained.

Figure 3B:
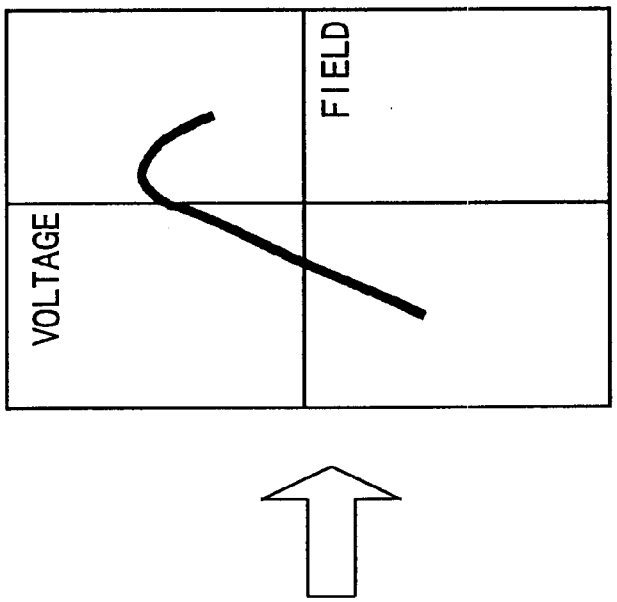
FIGS. 3A and 3B are graphs illustrating a field-voltage characteristic.
Figure 3A:
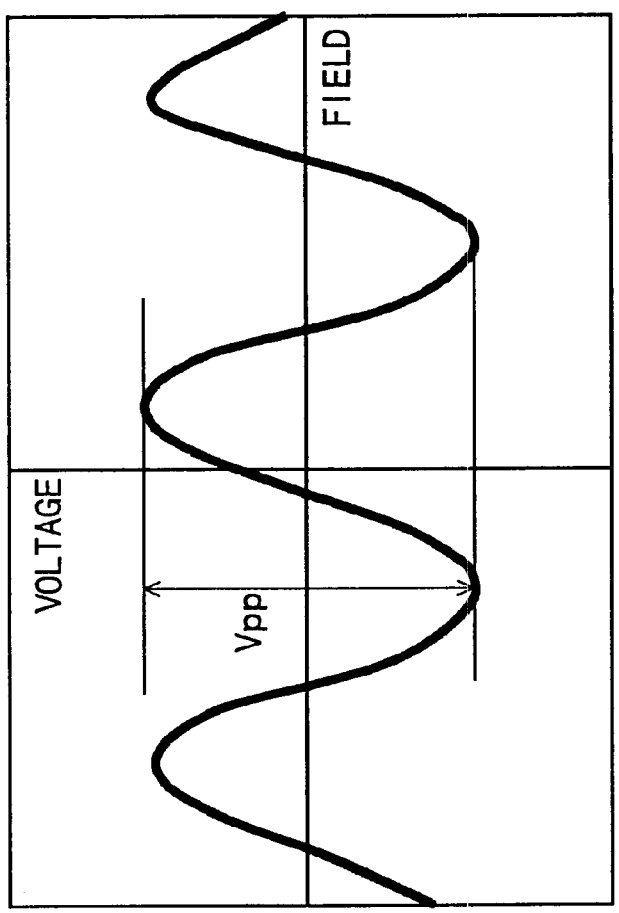

FIGS. 3A and 3B are graphs illustrating a field-voltage characteristic obtained by the generated field. FIG. 3A shows a state of the generated field and FIG. 3B shows a state corresponding to a desired half period which is picked out from the characteristic in FIG. 3A. "To pick out a desired half period" here means that a magnetic field corresponding to the desired half period is generated by adjusting the intensity of the field, as the period varies depending on a SQUID element even if the same current is applied.

Referring to FIG. 3A, the bias current is adjusted such that a maximum amplitude Vpp is at its maximum.

A method of adjusting the bias current is now described. FIGS. 4A to 4D illustrate a field-voltage characteristic signal corresponding to the half period shown in FIG. 3B, FIG. 4B showing change of the field with respect to time based on the signal, and FIG. 4C showing change of the voltage with time.

Figure 4A:
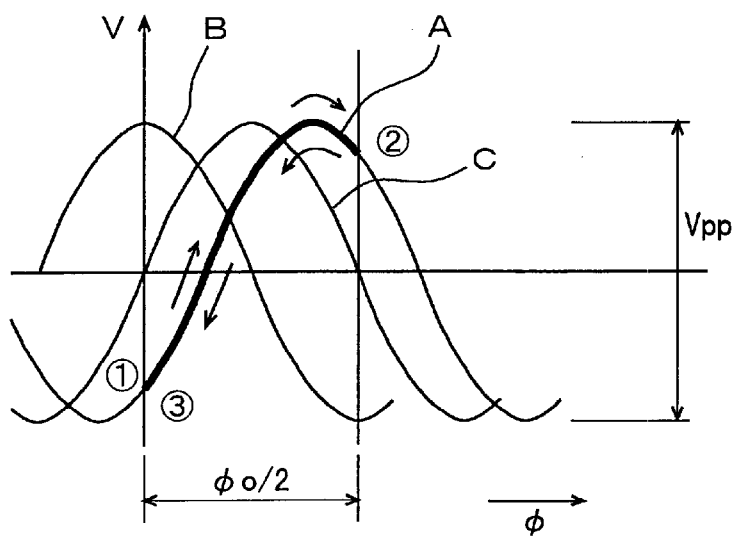
FIGS. 4A to 4D illustrate a method of adjusting a working point of a SQUID according to the first embodiment.
Figure 4B:
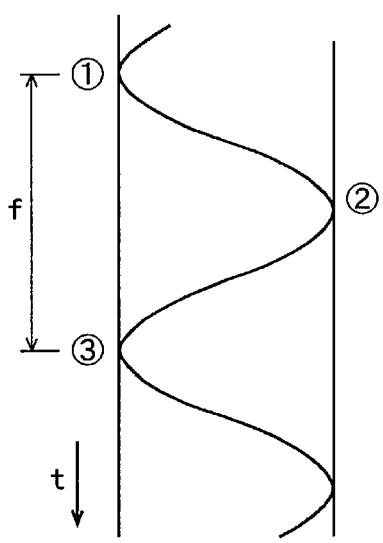
Figure 4C:
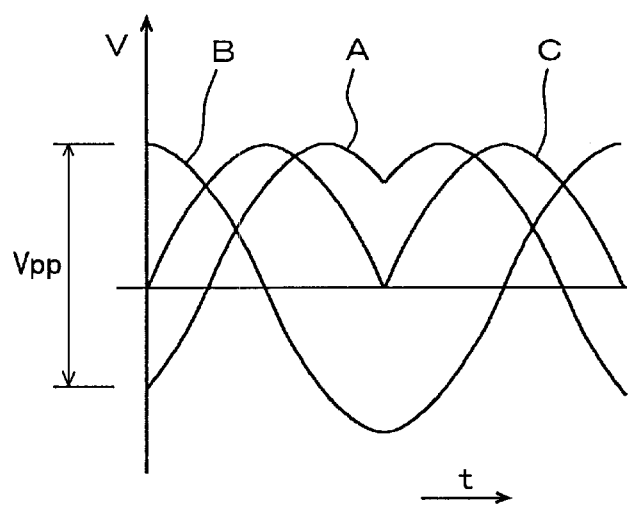

Referring to FIG. 4A showing field amplitudes corresponding to the half period, suppose that a signal of a half period represented by A is picked out. The half period A is arbitrarily chosen, therefore, maximum and minimum values are not necessarily included in the half period. The voltage changes from the state indicated by ① to the state ②, and returns the state indicated by ③ along the allows shown in the picked out half period A. This change is repeated. Change of the field with respect to time that is generated in these states is shown in FIG. 4B. As shown in FIG. 4B, the change of field occurs from ① to ③ in one period, the period being equal to the frequency, 40 kHz, of the sinusoidal current applied to coil 12.

Figure 4D:
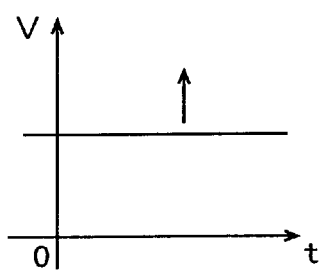

FIG. 4C shows change of the voltage with time based on FIGS. 4A and 4B. Referring to FIG. 4C, the change with time of a signal represented by the half period A is represented by A shown therein. Specifically, a frequency f1 of the signal includes both of the frequency f of the applied sinusoidal current and a frequency 2f twice the frequency f. This waveform appears at the portion indicated by C in FIG. 1. Only a signal with a waveform where the mixture of the frequency components exist is picked out by filter 14. This waveform is rectified by rectifier 15 to remove a high-frequency component thereof to obtain only a direct current component as shown in FIG. 4D. Bias current supply circuit 11 is manually adjusted by watching voltage monitor 16 such that this DC component, i. e. an output voltage V attains the maximum value.

A modification of the first embodiment is described below. FIG. 5 is a block diagram showing a bias current adjustment device for a SQUID according to the modification. Referring to FIG. 5, the SQUID bias current adjustment device shown is basically identical to that shown in FIG. 1. A difference is that an output from a rectifier 15 is transformed by an A/D converter 21 to a digital signal and then a personal computer 22 automatically applies feedback to a bias current supply circuit 11 so as to apply an optimum bias current therefrom to enable an output voltage V to have a maximum value. In this case, personal computer 22 is provided with a monitor 23.

According to this modification, the bias current can automatically be adjusted by personal computer 22.

Figure 6:
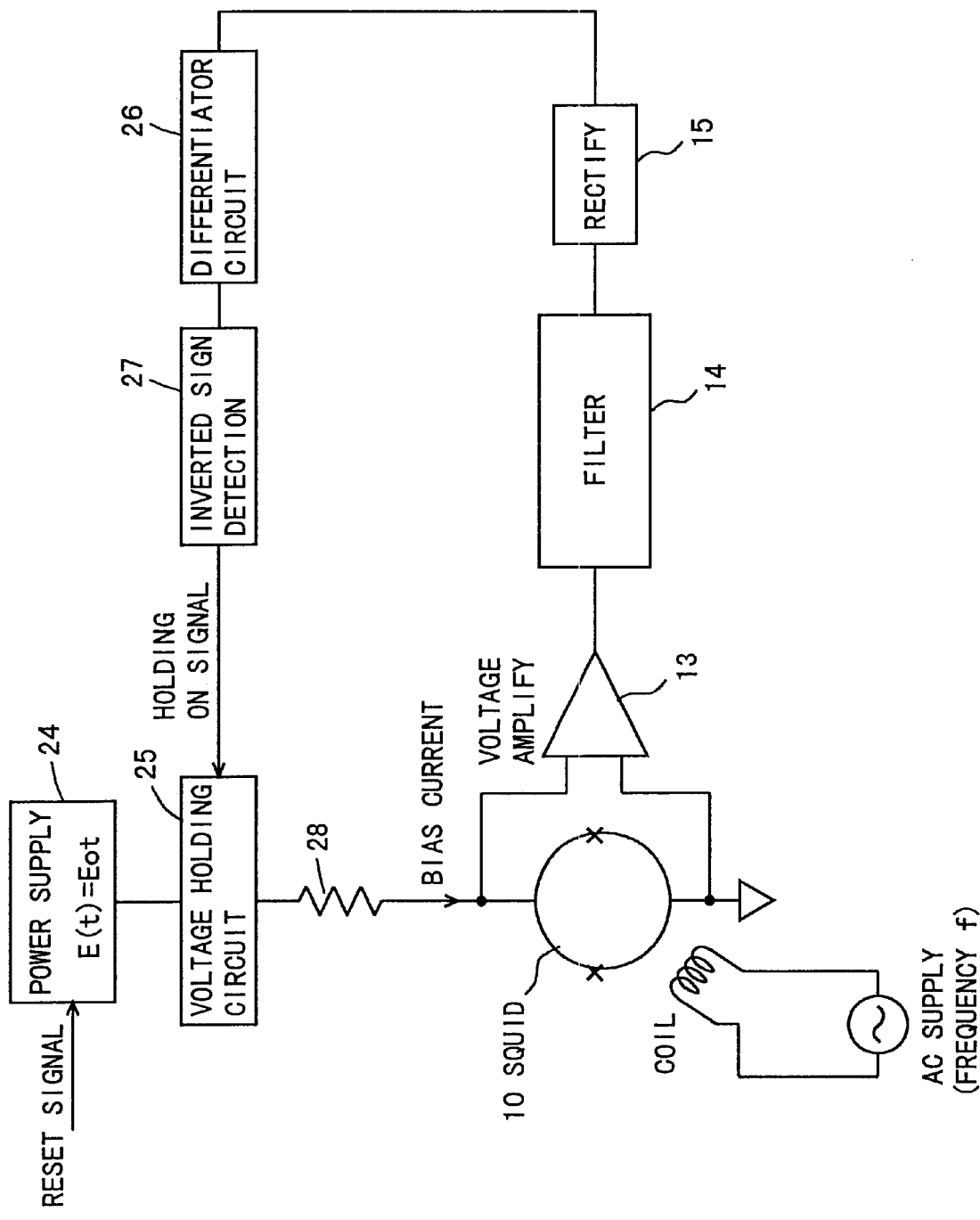
FIG. 6 is a block diagram showing a main portion of a SQUID working point adjustment device according to another modification of the first embodiment.

Another modification of the first embodiment is described below. FIG. 6 is a block diagram showing a SQUID bias current adjustment device according to that another modification. Referring to FIG. 6, the SQUID bias current adjustment device is basically identical to that shown in FIG. 1. A difference is that bias current supply circuit 11 is constituted of a power supply circuit 24 and a voltage holding circuit 25 and that an output from a rectifier 15 is fed back to voltage holding circuit 25 through a differentiator circuit 26 and an inverted sign detection circuit 27.

Specifically, a voltage signal of E (t)=E0t is applied by power supply circuit 24. This signal has a waveform with voltage increasing with time. This voltage is applied to a SQUID 10 through a resistor 28. With increase of a bias current, voltage from rectifier 15 increases, attaining a peak at an optimum point and decreasing subsequently. In other words, an amount of change varies from positive to negative. When the sign of the voltage from rectifier 15 through differentiator circuit 26 becomes negative (voltage decreases), a trigger signal is output to voltage holding circuit 25 to maintain the voltage value at that time.

This modification enables automatic setting of the bias current with an analog signal as it is, which is different from the embodiment above.

Second Embodiment

The second embodiment of the invention will be described now. The second embodiment relates to a non-modulation type SQUID working point adjustment device. FIG. 7 is a block diagram showing an entire structure of a SQUID bias current adjustment device according to the second embodiment. Referring to FIG. 7, the bias current adjustment device includes a SQUID 10, a bias current supply circuit 11 applying a bias current to SQUID 10, a coil 12 applying an alternating field at a frequency f and a direct field to SQUID 10, a voltage amplifier 13 amplifying voltage through both ends of SQUID 10, a filter 14 passing only a predetermined frequency component in the amplified voltage, a rectifier 15 rectifying a signal of the predetermined frequency component f, and a voltage monitor 16 for monitoring the rectified voltage. An AC source 32 applying an alternating current at frequency f and a field bias source 17 for applying a field bias to AC source 32 are connected to coil 12. In a device employing an actual SQUID, an output from voltage amplifier 13 is coupled to an integrator 31 to form a feedback loop for measuring a field. However, description of the actual measurement system is not given here and only an initial adjustment is discussed below.

FIGS. 8A to 8C are graphs showing a field-voltage characteristic obtained by a generated field. FIG. 8A shows a state of the generated field and FIG. 8B shows a state corresponding to a desired half period indicated by B that is chosen from FIG. 8A. FIG. 8C shows a state in which a field bias is adjusted such that the steepest gradient of the signal in the picked out half period crosses the zero point of the coordinates.

A method of adjusting the bias current is described below. FIGS. 9A to 9D illustrate a field-voltage characteristic in the half period shown in FIG. 8B, FIG. 9B showing a change of the field with time caused by the signal and FIG. 9C showing a change of the voltage with time.

Figure 9A:
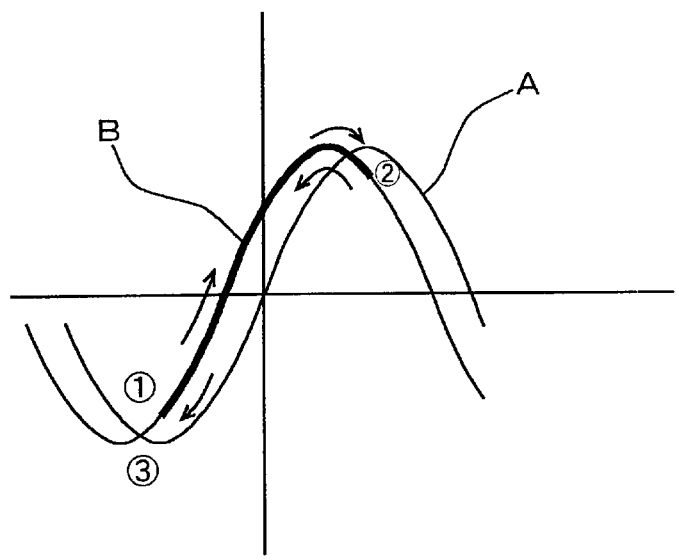
FIGS. 9A to 9D illustrate a method of adjusting a working point of a SQUID according to the second embodiment.
Figure 9B:
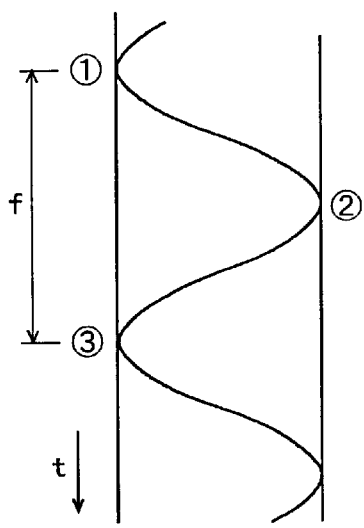
Figure 9C:
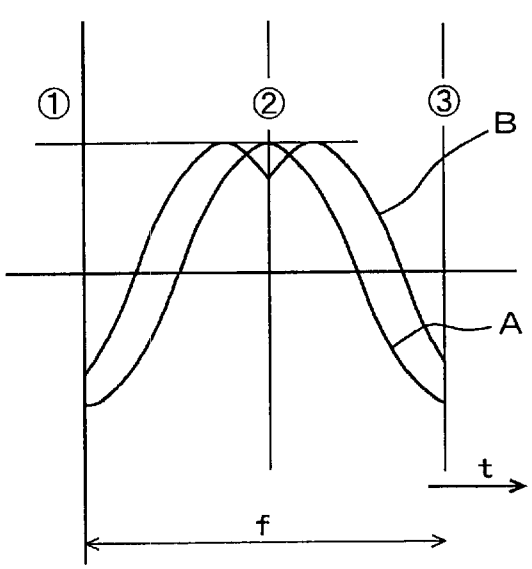
Figure 9D:
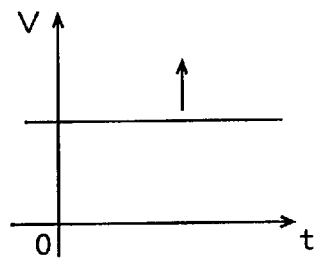

Referring to FIG. 9A showing states of field amplitudes each in a selected half period, suppose that a half period indicated by B is selected. The half period B is arbitrarily selected here, therefore, the steepest gradient portion in the half period does not necessarily cross the zero point of the coordinates. A waveform in the half period having a steepest gradient crossing the zero point of the coordinates is indicated by A.

In the picked out half period indicated by A and that by B, voltage changes from the state indicated by ① to the state indicated by ②, and returns to the state indicated by ③ along the arrows. This change is repeated. A change of field with time is illustrated in FIG. 9B based on the state in FIG. 9A. As shown in FIG. 9B, the field changes from ① to ③ in one period, the period being equal to frequency f of the sinusoidal current applied to coil 12 from AC source 31, f=1 kHz, for example.

FIG. 9C shows a change of the voltage with time based on FIGS. 9A and 9B. Referring to FIG. 9C, the change with time in the half period A and that in B are indicated by A and B respectively. Frequency f1 of B includes both of the frequency f of the applied sinusoidal current and frequency 2f which is twice the frequency f, while frequency f1 of A is equal to the frequency f of the applied sinusoidal current. The waveform appears at the point C shown in FIG. 7. Specifically, in order to make adjustment such that the steepest gradient portion in the half period crosses the zero point, an output frequency may be adjusted at f only.

According to the present invention, only a frequency component f is chosen by filter 14 in the signal indicated by B having a mixture of frequency components f and 2f that is arbitrarily picked out, and adjustment is made to allow the chosen component to attain the maximum value. Specifically, a waveform passing through filter 14 is rectified by rectifier 15 to remove a high frequency component thereof and thus obtain only a direct current component as shown by the waveform in FIG. 9D. Bias current supply circuit 11 is accordingly adjusted manually by watching voltage monitor 16 such that this DC component, i. e. output voltage V has a maximum value. In this way, the steepest gradient portion of the field-voltage change is set at the zero point so as to maximize the amount of voltage change relative to change of field, and thus maximize the field sensitivity of the SQUID.

Figure 10:
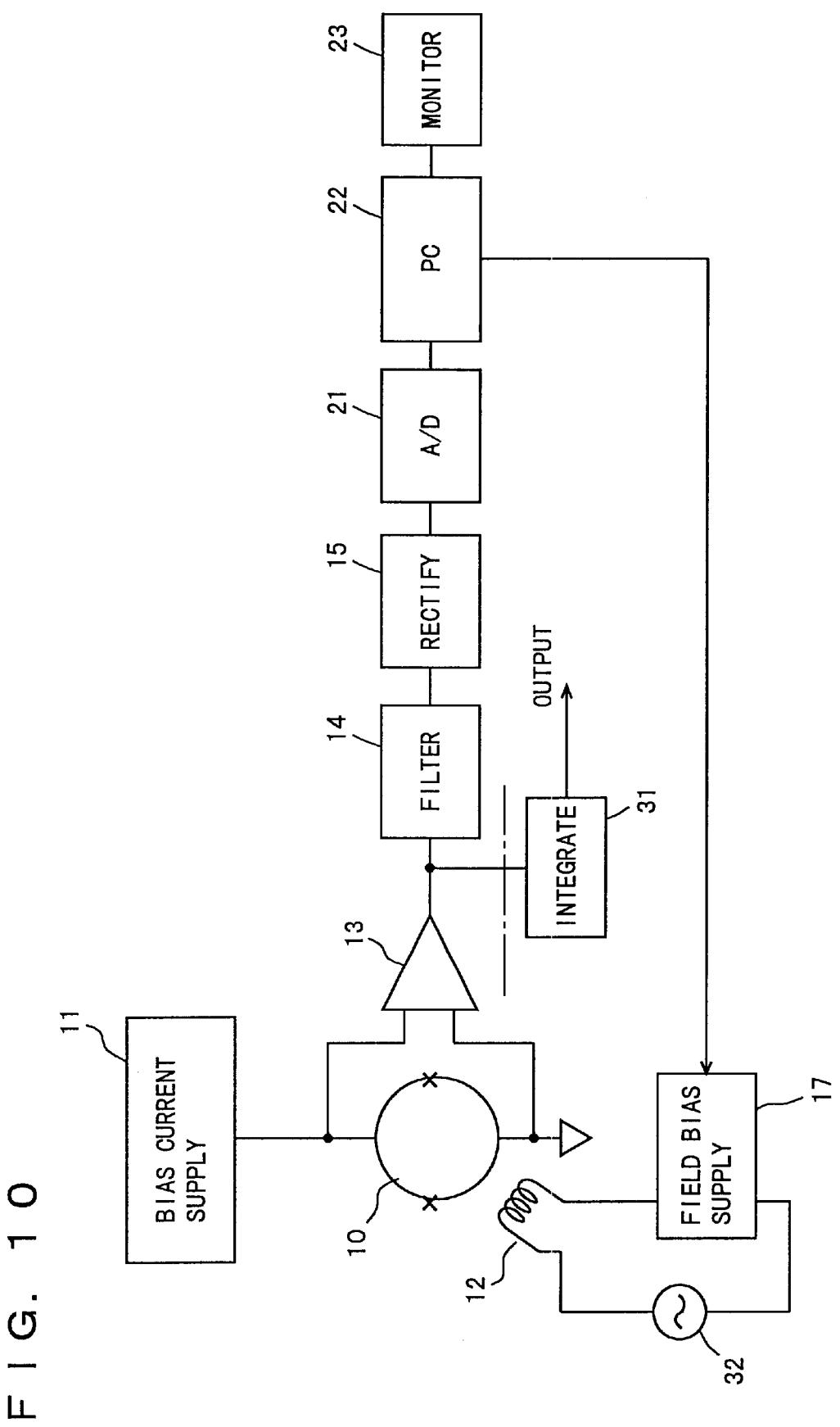
FIG. 10 is a block diagram showing a main portion of a SQUID working point adjustment device according to a modification of the second embodiment.

A modification of the second embodiment is described below. FIG. 10 is a block diagram showing a SQUID bias current adjustment device according to the modification of the second embodiment. Referring to FIG. 10, the bias current adjustment device shown is basically identical to that shown in FIG. 7. A difference is that an output of a rectifier 15 is transformed by an A/D converter 21 to a digital signal and a personal computer 22 automatically applies feedback to a field bias supply circuit 17 to supply an optimum field bias therefrom such that output voltage V is at its maximum. In this case, personal computer 22 is provided with a monitor 23.

According to this modification, a field bias can be adjusted automatically by personal computer 22.

Figure 11:
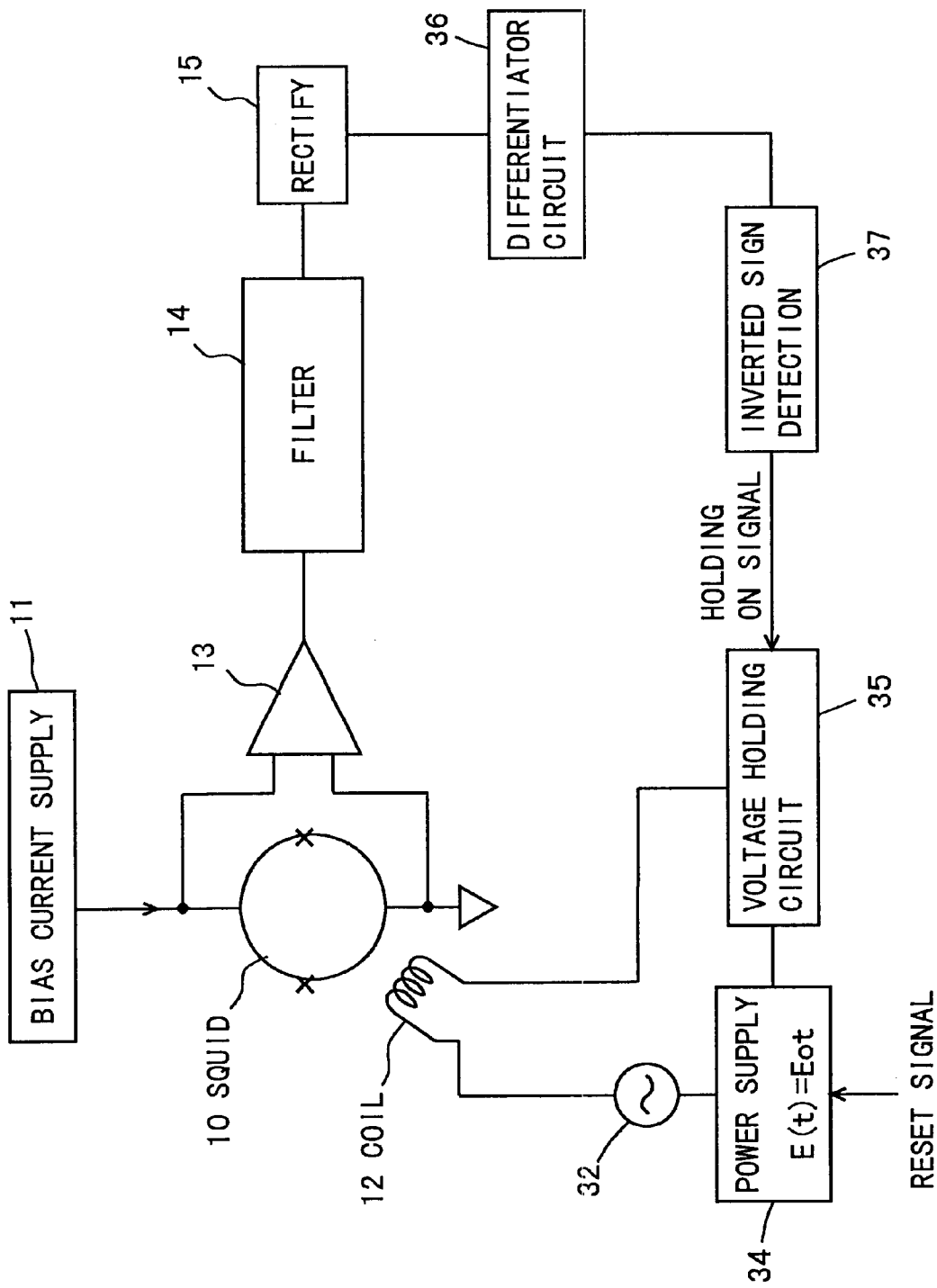
FIG. 11 is a block diagram showing a main portion of a SQUID working point adjustment device according to another modification of the second embodiment.

Another modification of the second embodiment is described below. FIG. 11 is a block diagram showing a SQUID bias current adjustment device according to the another modification of the second embodiment. Referring to FIG. 11, the SQUID bias current adjustment device is basically identical to that shown in FIG. 7. A difference is that field bias supply circuit 17 is constituted of a power supply circuit 34 and a voltage holding circuit 35 and that an output from a rectifier 15 is fed back to voltage holding circuit 35 through a differentiator circuit 36 and an inverted sign detection circuit 37.

Specifically, a voltage signal of E (t)=E0t is applied by supply circuit 34. This signal has a waveform with voltage increasing with time. This voltage is superimposed on an alternating voltage at frequency f to be applied to a SQUID 10. With increase of field bias voltage, voltage from rectifier 15 increases, attaining a peak at an optimum point and decreasing subsequently. In other words, the amount of change varies from positive to negative. When voltage of rectifier 15 passing through differentiator circuit 36 has a negative sign (voltage decreases), a trigger signal is output to voltage holding circuit 35 to maintain the voltage value at this time.

According to this modification, bias current can be set automatically with an analog signal as it is, which is different from the embodiments above.

Third Embodiment

The third embodiment of the present invention is described in conjunction with the drawings. The third embodiment also relates to a non-modulation type SQUID working point adjustment device.

Figure 12:
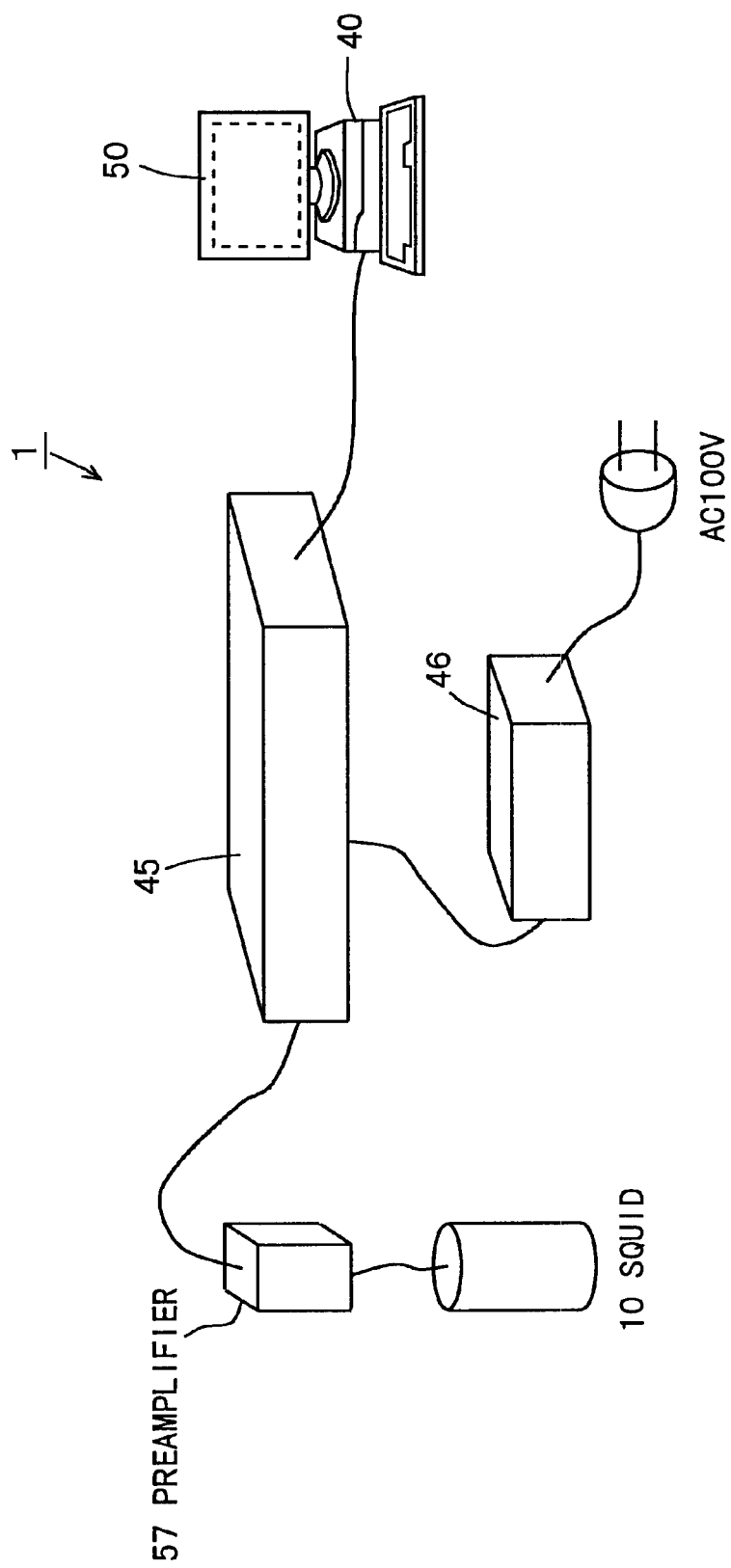
FIG. 12 shows an entire structure of a SQUID magnetometer according to a third embodiment of the invention.

FIG. 12 shows an entire structure of a SQUID magnetometer 1 according to the third embodiment. SQUID magnetometer 1 in the third embodiment includes a SQUID 10, a preamplifier 57 amplifying an output voltage of SQUID 10, a drive circuit main body 45 connected to preamplifier 57 to drive the SQUID, a DC supply circuit 46 supplying power to the drive circuit body, and a personal computer 40 connected to the drive circuit body 45 to control the operation of the SQUID via the drive circuit body 45.

FIG. 13 is a block diagram showing a main portion of SQUID magnetometer 1 shown in FIG. 12. Referring to FIG. 13, SQUID magnetometer 1 includes SQUID 10, a feedback coil 56 for applying a feedback current for an FLL to SQUID 10, and a heater 55 for releasing trapped flux in SQUID 10. Voltage between both ends of SQUID 10 is transmitted to the drive circuit body 45. The elements in parentheses in respective blocks in FIG. 13 are controlled by personal computer 40.

Drive circuit body 45 includes a heater circuit 54 controlling ON/OFF of heater 55, a current bias circuit 61 for applying a current bias to SQUID 10, an amplifier 62 amplifying voltage from preamplifier 57 which is the amplified output of SQUID 10, an integrator 63 determining the integral of an output from amplifier 62, a field bias circuit 64 connected to integrator 63 for applying a predetermined field bias to a feedback signal, a feedback circuit 65 for transmitting to feedback coil 56 the feedback signal to which the field bias is applied, and an oscillator circuit 66 supplying a field signal to feedback coil 56 for adjusting the working point.

Personal computer 40 includes an analog/digital (A/D) converter 41 transforming an analog signal from integrator 63 or amplifier 62 to a digital signal, a digital output unit 42 supplying to heater circuit 54, current bias circuit 61, field bias circuit 64, feedback circuit 65 and oscillator circuit 66 digital signals used for control, a data storage unit 44 storing data of measurement by SQUID 10, and a control unit controlling A/D converter 41, digital output unit 42 and data storage unit 44. A display unit 50 is connected to personal computer 40 for operating SQUID magnetometer 1 described below via display unit 50.

Figure 14:
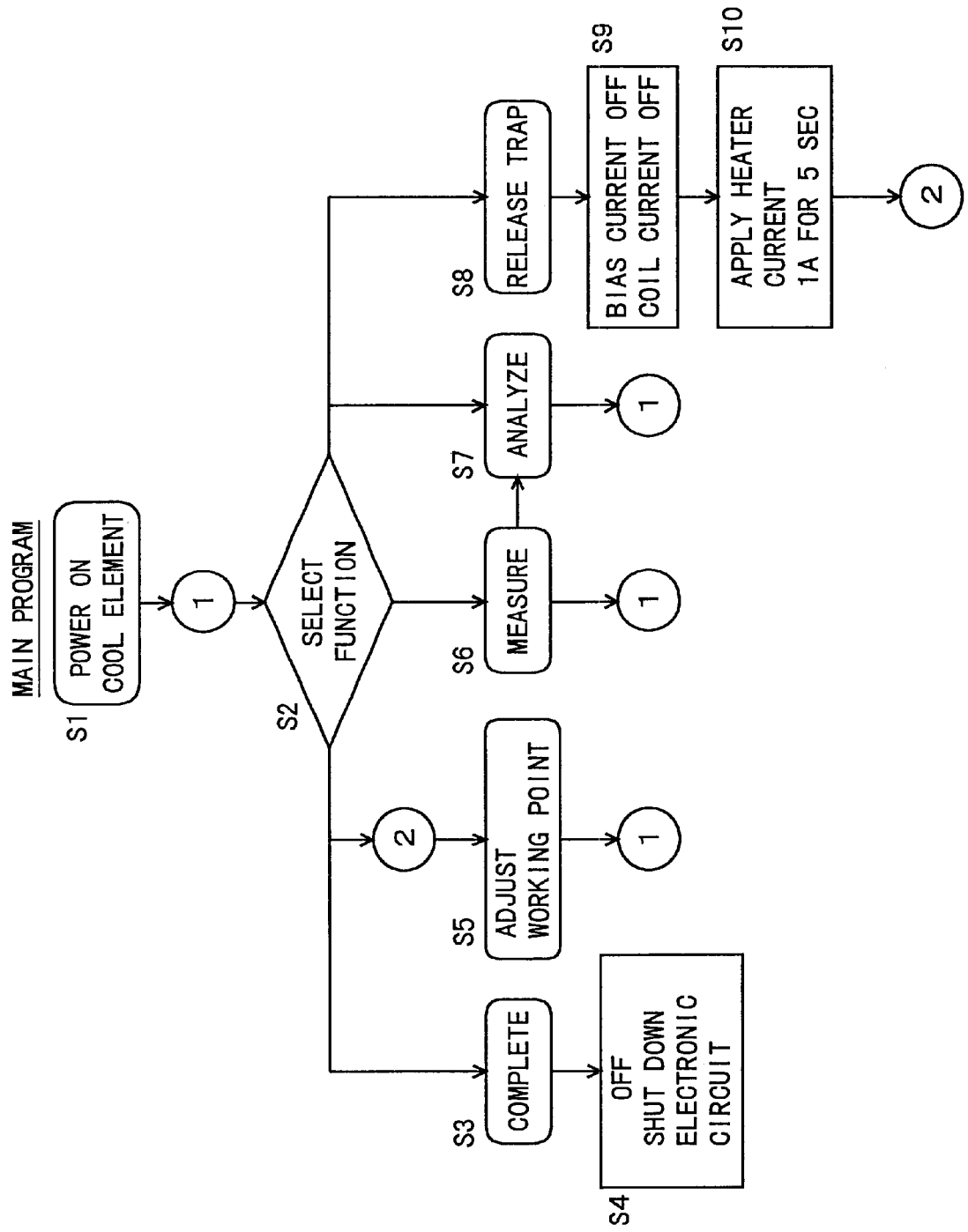
FIG. 14 is a flowchart showing details of a main program of the SQUID magnetometer according to the third embodiment.

An operation of SQUID magnetometer 1 is now described. FIG. 14 is a flow chart illustrating details of the processing in a main program of SQUID magnetometer 1 according to the third embodiment of the invention. Referring to FIG. 14, the device is powered to cool SQUID 10 (step S1, hereinafter referred to just as S1, . . . without "step"). Function selection is done next (S2) to perform a desired operation.

Functions to be selected includes "complete" (S3), "adjust working point" (S5), "measure" (S6), "analyze" (S7) and "release trap" (S8).

By "complete," the entire device is turned off and an electronic circuit is shut down (S4).

By "release trap," the bias current of current bias circuit 61 is made off and the coil current of feedback coil 12 is made off (S9). Following this, a heater current of 1A is applied for five seconds (S10).

Figure 15:
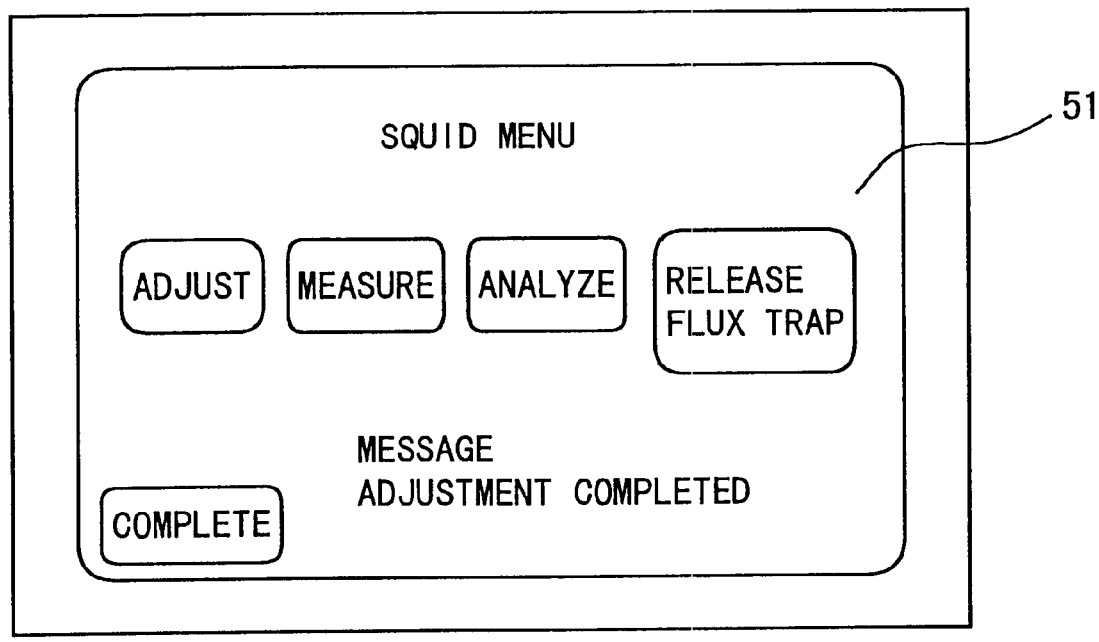
FIG. 15 shows a menu screen.

Processing details of each function are given below. FIG. 15 shows a menu screen of SQUID magnetometer 1 that is displayed on display unit 50. On the menu screen, "SQUID MENU" as well as buttons indicating "ADJUST," "MEASURE," "ANALYZE," "RELEASE FLUX TRAP" and "COMPLETE" are displayed. All these functions are performed by selecting any button displayed.

Figure 16:
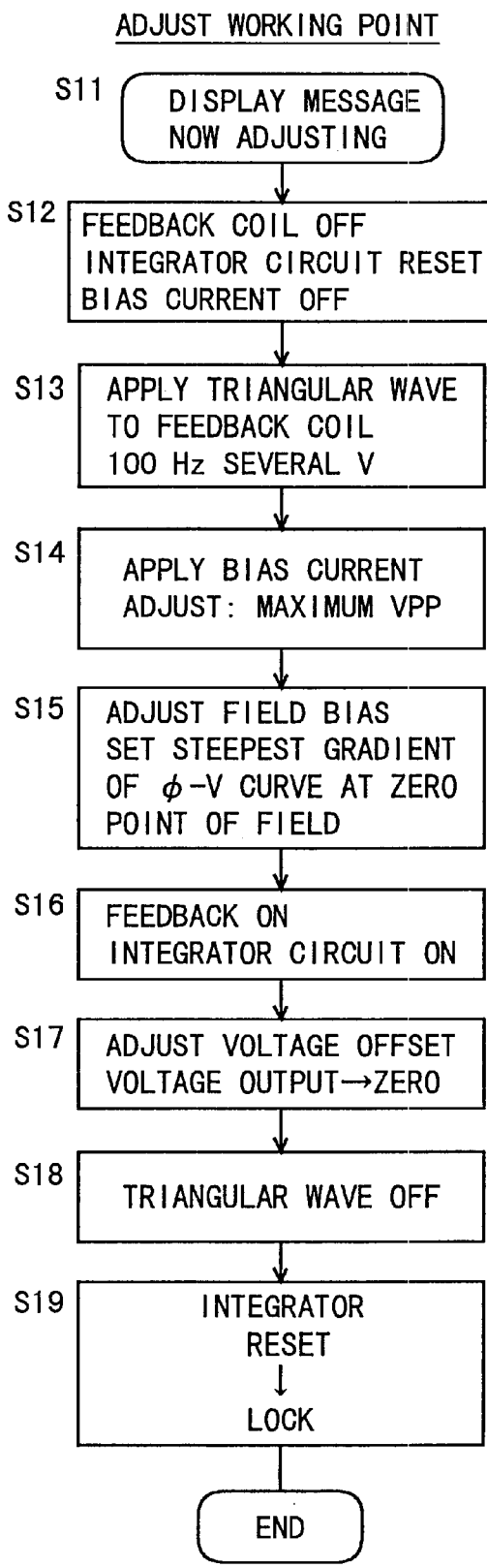
FIG. 16 is a flowchart showing details of a working point adjustment process.

The adjustment of the working point of the SQUID shown by S5 in FIG. 14 is described in conjunction with FIGS. 15 and 16. FIG. 16 is a flow chart showing details of working point adjustment processing. Referring to FIGS. 15 and 16, the working point is adjusted following the procedure below.

A message "NOW ADJUSTING" is first displayed on menu screen 51 (S11). During the display, feedback coil 56 is made off, integrator 63 is reset, and an instruction is issued to current bias circuit 61 to make the bias current off (S12).

Next, a signal is applied to feedback coil 56 by oscillator circuit 66. This signal has a triangular wave at 1 to 100 kHz and several volts (S13).

Then, a bias current is adjusted to maximize Vpp of an output voltage of a voltage terminal (S14).

Offset of amplifier 62 and field bias are adjusted to allow the steepest gradient of a φ-V curve to be located at the zero point of a field-voltage graph (S15).

Figure 17B:
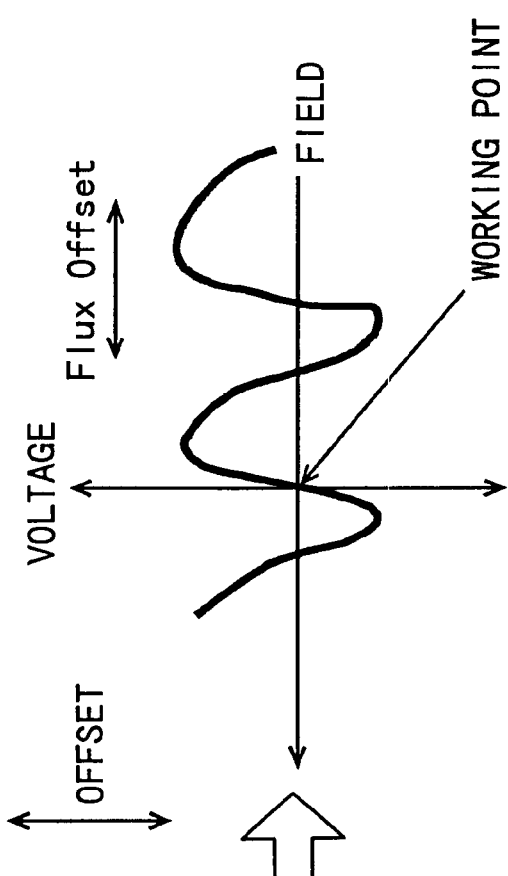
FIGS. 17A and 17B illustrate details of working point adjustment.
Figure 17A:
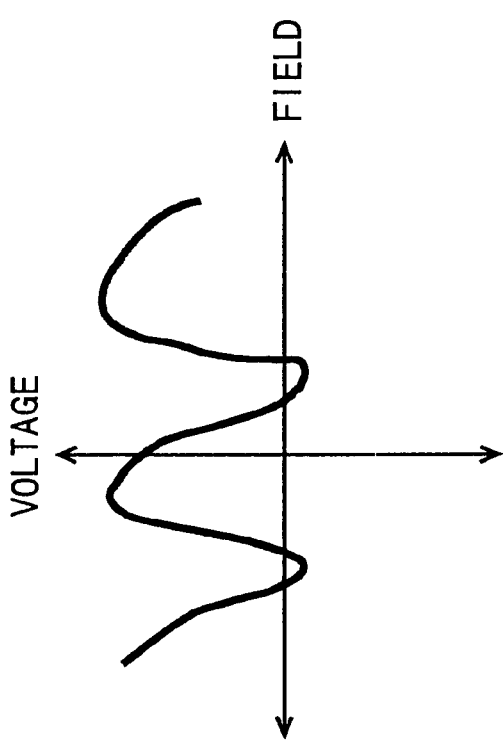

Referring to FIGS. 17A and 17B, the adjustment of the working point is described. FIG. 17A shows a waveform in a graph illustrating a field-voltage characteristic before adjustment of offset and the like. FIG. 17B illustrates a state in which the offset of amplifier 62 is adjusted to adjust the position in the voltage direction, field (FLUX) bias is adjusted to adjust the position in the field direction, and accordingly these adjustments allow the steepest gradient portion of the φ-V curve to be located at the zero point.

Referring back to FIG. 16, feedback circuit 65 and integrator 63 are made on (S16).

Voltage offset adjustment is done and voltage output is set at zero (S17) and the triangular wave is made off by oscillator circuit 66 (S18). After this, integrator 63 is locked and a message "ADJUSTMENT COMPLETED" is displayed on menu screen 51.

Figure 18:
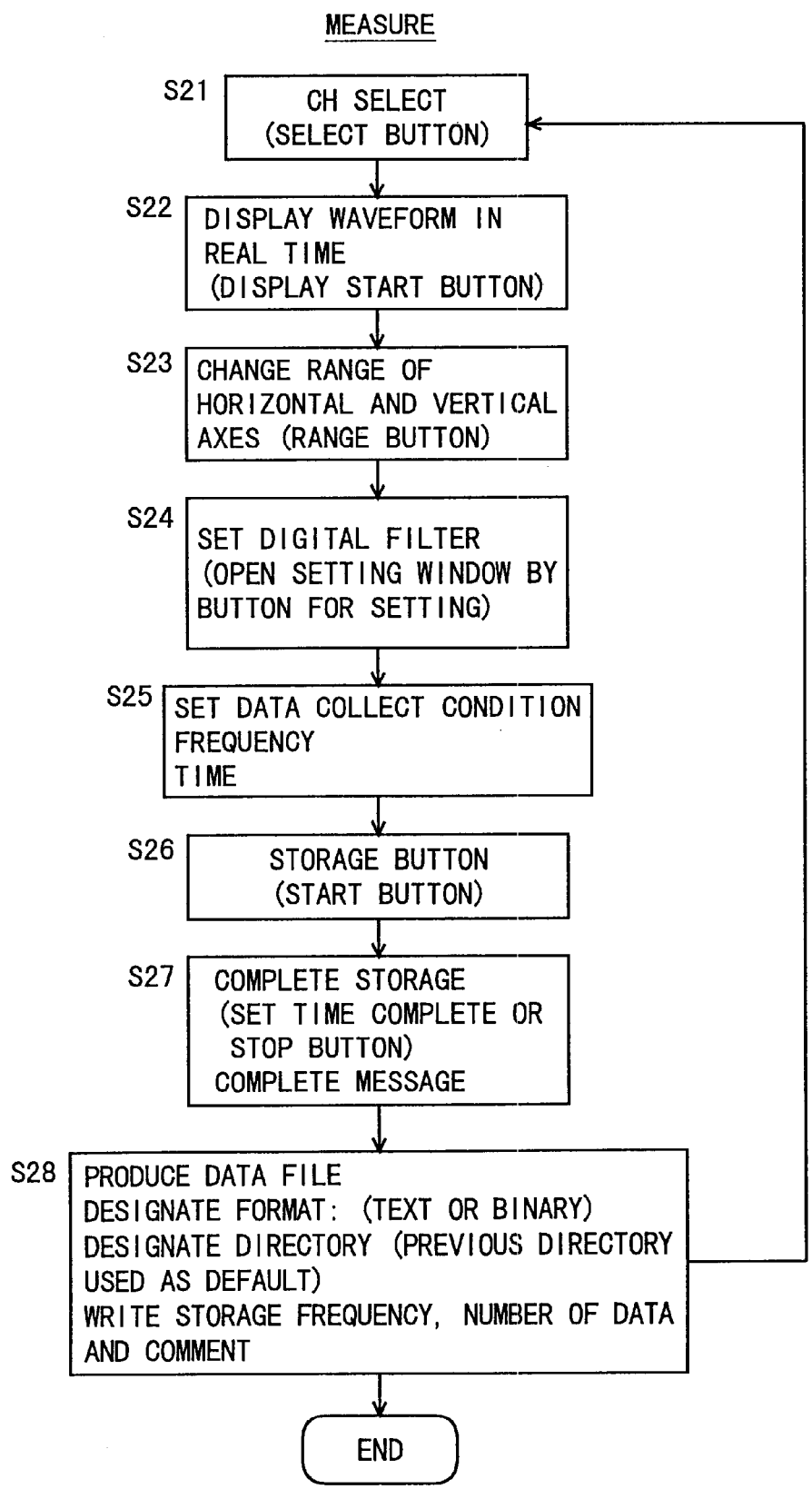
FIG. 18 is a flowchart showing details of a measurement process.
Figure 19:
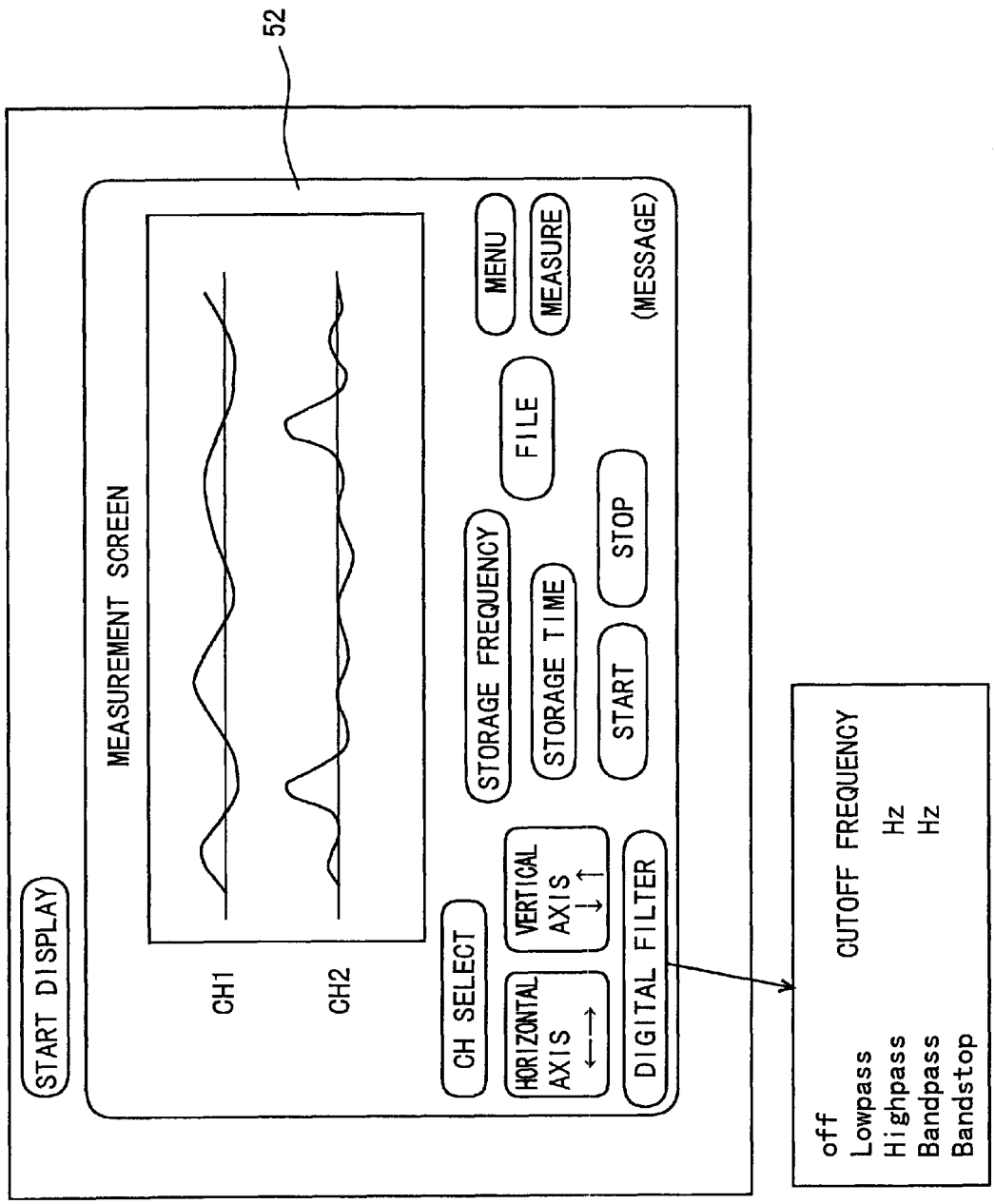
FIG. 19 shows a measurement screen.

The state of measurement shown by S6 in FIG. 14 is described below. FIG. 18 is a flow chart showing details of the measurement processing. FIG. 19 shows a measurement screen. Referring to FIGS. 18 and 19, the measurement processing is described now. "MEASURE" button on menu screen 51 is pressed to change this screen to a measurement screen 52 in FIG. 19. This screen can be changed to an analysis screen 53 and menu screen 51 by the buttons.

Description of display of a waveform in real time is given below. A display channel is selected by a channel select button (CH select button) (S21). In this state, "START" button is pressed to realize a real time display of a waveform (S22).

In this state, "HORIZONTAL AXIS" and "VERTICAL AXIS" buttons are pressed to adjust the range of the horizontal and vertical axes (S23). "DIGITAL FILTER" button is used for setting a digital filter (low-pass, high-pass, bandpass, bandstop, cutoff frequency) and then a filtered waveform is displayed (S24).

Description of data storage is given below. "STORAGE FREQUENCY" and "STORAGE TIME" buttons are used for setting a sampling frequency and a storage time (S25).

Storage is started by "START" button and a message "NOW STORING DATA" is displayed on the measurement screen (S26). The waveform is also displayed during the data storage period. The A/D changes a range according to a signal being supplied. Pressing of a (amplifier gain) stop button stops the storage and accordingly a message indicating this is displayed (S27). "FILE" button is pressed to produce a data file (S28). A file name and a directory are designated. A previously stored directory is used as default. File format is selected from text (comma punctuation) and binary. Storage frequency and the number of pieces of data (storage time) are stored in the file.

Figure 20:
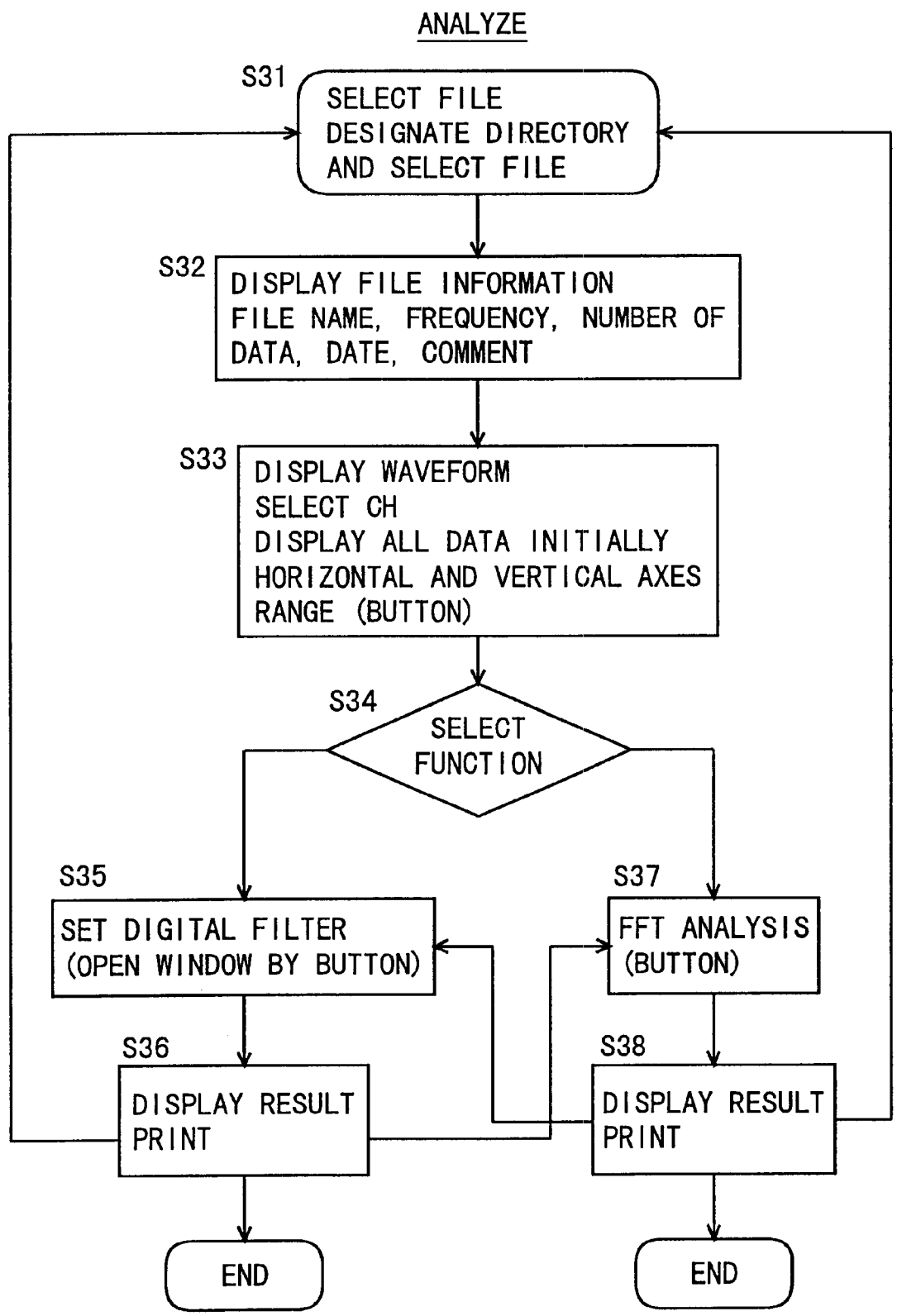
FIG. 20 is a flowchart showing details of an analysis process.
Figure 21:
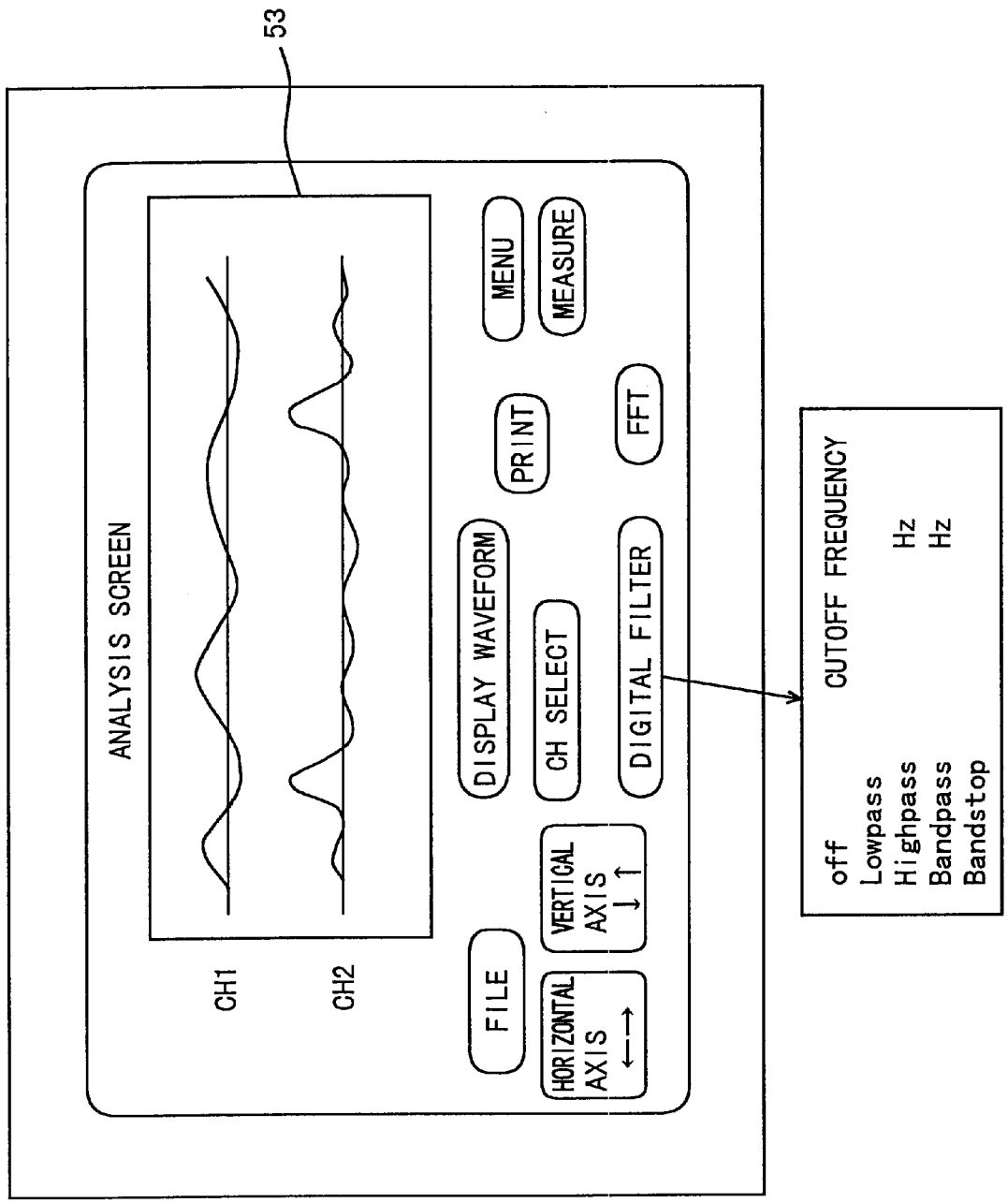
FIG. 21 shows an analysis screen.

The analysis shown by S7 in FIG. 14 is described. FIG. 20 is a flowchart showing details of the analysis processing and FIG. 21 shows analysis screen 53 on display unit 50. Referring to FIGS. 20 and 21, "MEASURE" and "MENU" buttons on analysis screen 53 can be pressed to return the screen to measurement screen 52 and menu screen 51 respectively.

A file to be analyzed is selected and the file is read (S31). At this time, "FILE" button is used for selecting a data file and the data is read to display its waveform. When the file is selected, storage frequency, time and comment are displayed (S32). "CH SELECT" button is pressed to select a display channel and "HORIZONTAL AXIS" and "VERTICAL AXIS" buttons are used to change the range (S33).

A desired function is selected (S34), then "DIGITAL FILTER" button can be used to set a digital filter (S35) or "FFT" button can be used for performing FFT (Fast Fourier Transform) analysis (S37), for example. Details of the digital filter is the same as those described concerning "DIGITAL FILTER" button on measurement screen 52.

After the analysis by the digital filter or FFT, the displayed waveform and the result of analysis are printed out (S36, S38).

After the printing, another analysis may be performed or another file may be selected to do another analysis thereon (S31).

When "RELEASE TRAP" button shown by S8 in FIG. 14 is pressed, feedback coil 56 is made off, flux bias is set zero, and bias current is shut off to stop application of field and current to SQUID 10, and then current of 1A is supplied to heater 55 for 5 seconds and subsequently the current flow is stopped and this state is left as it is for 15 seconds. During this period, a message "TRAP BEING RELEASED" is displayed on menu screen 51. After this, the working point is adjusted and SQUID 10 enters the operating state.

Pressing of "COMPLETE" button makes feedback coil 56 off to cut the bias current, and accordingly the program is completed.

Fourth Embodiment

Figure 22:
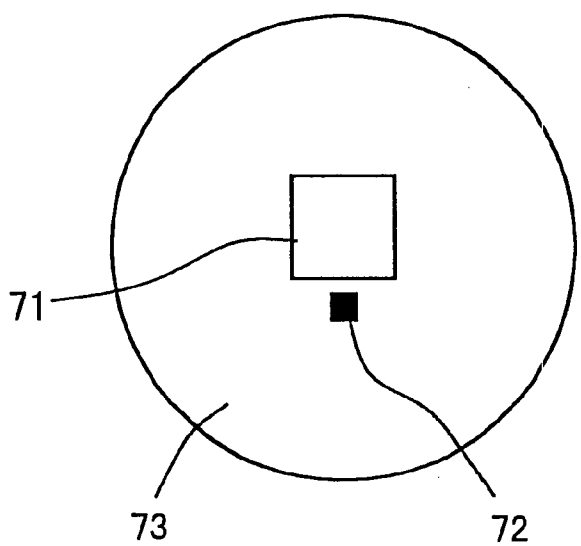
FIG. 22 is a front view of a chip including a SQUID element according to a fourth embodiment of the invention.
Figure 26:
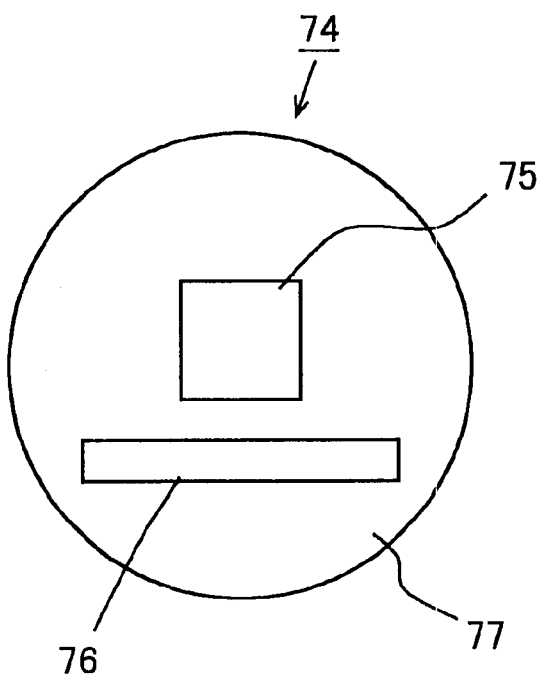
FIG. 26 shows a conventional arrangement of a SQUID and a heater.

The fourth embodiment of the invention is described now in conjunction with the drawing. The fourth embodiment relates to a heater of a SQUID which is employed in the first to the third embodiments. FIG. 22 shows a SQUID element that constitutes a SQUID magnetic sensor, with a heater incorporated therein. Referring to FIG. 22, SQUID element 71 formed on a substrate of strontium titanate having one side of 5 mm in length and a thickness of 1 mm was fixed on a chip carrier 73 formed of glass epoxy with a diameter of 31 mm and a thickness of 1 mm, and a resistor 72 was employed as a heater which is fixed at a location approximately 2 mm apart from SQUID element 71.

The chip carrier shown in FIG. 22 was used and release of a superconducting state in liquid nitrogen of 77 k was confirmed.

The resistor herein used was of 10 Ω and an allowable input of 1/16 W. Actual input power was 0.9 W (input power 0.9 W at 3V and 0.3 A), and the average time consumed to release the superconducting state was about 7 seconds, according to experiment conducted 30 times.

Table 1 shows conditions for releasing trapped flux according to the experiment.

TABLE 1

| Resistor (Ω) | Allowable Input (W) | Input Power (W) | Time to Release Superconducting State (sec) |
|---|---|---|---|
| 10 | 1/16 | 0.9 | 7 |
|  |  | 0.3 | 35 |
|  |  | 4.5 | 1 |

Referring to Table 1, trap was released with minimum input 0.3 W in 35 seconds, and with 0.9 W in 7 seconds. With the maximum input of 4.5 W, trap was released in one second. This period of time is sufficiently short.

As clearly understood from Table 1, the greater the applied power, the shorter the time required to release the trap.

A resistor with an allowable input 1/16 W could be used to apply the maximum input of 4.5 W. Therefore, for the allowable input, the maximum input which is 70 times as great as the allowable input could be applied. Wire was broken when the power was 4.5 W or more.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A SQUID working point adjustment device comprising:
    a SQUID;
    means for supplying a bias current to said SQUID;
    means for applying an alternating magnetic field at a predetermined frequency to said SQUID to which said bias current is being supplied;
    means for picking out an output corresponding to a half period from said SQUID which is modulated by said applied magnetic field;
    means for determining an optimum value of said bias current based on the output corresponding to change of the magnetic field;
    a heater; and
    control means for controlling said heater for releasing trapped flux said control means automatically adjusting a bias magnetic field in a state that said bias current is adjusted such that an output voltage of said SQUID is at its maximum when an initial working point of said SQUID is adjusted.

2. The SQUID working point adjustment device according to claim 1, wherein said means for determining the optimum value of said bias current includes a filter for picking out from said picked out SQUID output corresponding to a half period an output voltage having components of said predetermined frequency and of a frequency twice said predetermined frequency.

3. The SQUID working point adjustment device according to claim 1, further comprising means for feeding said determined optimum value of said bias current back to said means for supplying said bias current.

4. A method of adjusting a working point of a SQUID comprising the steps of:

supplying a bias current to the SQUID;

applying an alternating power source at a predetermined frequency to said SQUID to which said bias current is being supplied to generate a bias magnetic field;

picking out field corresponding to a half period from said generated magnetic field; and determining an optimum value of said bias current based on an output corresponding to change of said picked out field;

controlling a heater to release trapped flux; and automatically adjusting said bias magnetic field in a state that said bias current is adjusted such that an output voltage of said SQUID is at its maximum when an initial working point of said SQUID is adjusted.

5. A SQUID working point adjustment device comprising:

a SQUID;

means for supplying a predetermined bias current to said SQUID;

a coil for applying a magnetic field to said SQUID, an alternating current at a first frequency and an adjustable direct current being applied to said coil;

means for picking out a field-voltage characteristic signal corresponding to a half period from said SQUID to which said bias current is being supplied;

a filter for passing only a component of said first frequency in said picked out field- voltage characteristic signal;

a rectifier coupled to the output of the filter;

means, coupled to an output of said rectifier, for monitoring the signal component passed through said filter.

6. The SQUID working point adjustment device according to claim 5, further comprising means for adjusting the direct current applied to said coil such that the signal component passed through said filter is at its maximum.

7. A method of adjusting a working point of a SQUID comprising the steps of:

supplying a predetermined bias current to said SQUID;

applying a magnetic field using a coil to said SQUID, an alternating current at a first frequency and an adjustable direct current being applied to said coil;

picking out a field-voltage characteristic signal corresponding to a half period from said SQUID to which said bias current is being supplied;

passing only a component of said first frequency in said picked out field-voltage characteristic signal;

rectifying the component; and monitoring said rectified signal component.

8. A SQUID magnetometer comprising:

a SQUID;

means for applying a predetermined bias current to said SQUID;

means for detecting an output of said SQUID to which said bias current is being applied;

feedback means for feeding the output of said SQUID back to an amount of the bias current to said SQUID;

means for applying a bias magnetic field to said feedback means; and control means for automatically adjusting said bias magnetic field in a state that said bias current is adjusted such that an output voltage of said SQUID is at its maximum when an initial working point of said SQUID is adjusted; and a heater for releasing a trapped flux, wherein
said control means controls the heater for releasing the trapped flux.

9. The SQUID magnetometer according to claim 8, wherein said control means includes means for storing flux data measured by using said SQUID magnetometer.

10. The SQUID magnetometer according to claim 8, wherein said control means includes means for analyzing flux data measured by using said SQUID magnetometer.

11. A superconducting magnetic sensor heater for releasing trapped flux of a superconducting magnetic sensor employing a superconducting quantum interference device, said heater having a fixed allowable input power, a predetermined input power being applied to said heater for releasing said trapped flux, and said allowable input power of said heater being smaller than said predetermined applied power.

12. The superconducting magnetic sensor heater according to claim 11, wherein said allowable input power is at most 0.1 watt.

13. The superconducting magnetic sensor heater according to claim 11, wherein said applied power is at most several watts.

* * * * *